(12) United States Patent
Park et al.

(10) Patent No.: US 11,849,624 B2
(45) Date of Patent: Dec. 19, 2023

(54) DISPLAY DEVICE HAVING SWITCHABLE VIEWING ANGLE

(71) Applicant: LG DISPLAY CO., LTD, Seoul (KR)

(72) Inventors: WonKi Park, Paju-si (KR); Sumin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 202 days.

(21) Appl. No.: 17/528,708

(22) Filed: Nov. 17, 2021

(65) Prior Publication Data
US 2022/0199712 A1 Jun. 23, 2022

(30) Foreign Application Priority Data
Dec. 23, 2020 (KR) .......................... 10-2020-0182615

(51) Int. Cl.
| | |
|---|---|
| *H01L 51/52* | (2006.01) |
| *H10K 59/50* | (2023.01) |
| *H10K 59/35* | (2023.01) |
| *G02F 1/17* | (2019.01) |
| *H10K 59/122* | (2023.01) |

(52) U.S. Cl.
CPC .......... *H10K 59/50* (2023.02); *H10K 59/351* (2023.02); *H10K 59/353* (2023.02); *G02F 1/17* (2013.01); *G02F 2202/14* (2013.01); *G02F 2203/05* (2013.01); *H10K 59/122* (2023.02)

(58) Field of Classification Search
CPC .... H10K 59/50; H10K 59/351; H10K 59/353; H10K 50/865; H10K 59/352; G02F 1/17; G02F 2202/14; G02F 2203/05; G09G 3/3258
See application file for complete search history.

*Primary Examiner* — Donald L Raleigh
(74) *Attorney, Agent, or Firm* — POLSINELLI PC

(57) ABSTRACT

A display device having switchable viewing angle includes a display panel including a first emission area, a second emission area, a third emission area and a fourth emission area, from which light in different wavelength bands is emitted, and a transparent photochromic layer disposed on at least one surface of the display panel, wherein each of the first emission area, the second emission area and the third emission area emits light in a wavelength band of visible light, the fourth emission area emits light in a wavelength band of ultraviolet ray, and when the fourth emission area is in an emission state, an area of the photochromic layer including the area corresponding to the fourth emission area is an opaque area, and wherein when the fourth emission area is in a non-emission state, an area of the photochromic layer including the area corresponding to the fourth emission area is a transparent region, thereby providing a display device capable of switching viewing angles.

15 Claims, 11 Drawing Sheets

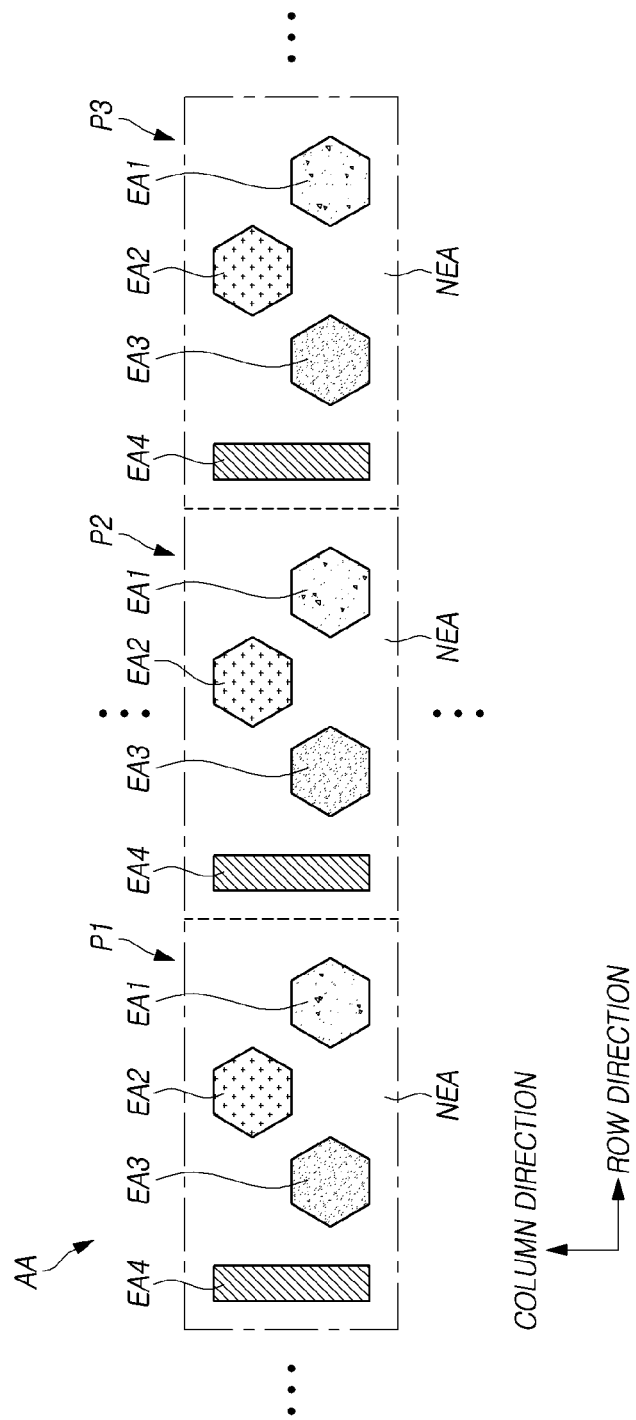

DISPLAY DEVICE HAVING SWITCHABLE VIEWING ANGLE

CROSS-REFERENCE TO RELATED APPLICATION

This application claims the priority of Korean Patent Application No. 10-2020-0182615, filed on Dec. 23, 2020, which is hereby incorporated by reference in its entirety for all purposes as if fully set forth.

BACKGROUND

Field of the Disclosure

The present disclosure relates to a display device having switchable viewing angle.

Description of the Background

In general, a display device is widely used as a display screen for a variety of electronic products including portable electronic devices such as e.g., a mobile communication terminal, a personal digital assistant (PDA), an e-book, a portable multimedia player (PMP), a navigation system, an ultra-mobile PC (UMPC), a mobile phone, a smart phone, a tablet personal computer (PC), a watch phone, and so on, and various products such as e.g., a TV, a laptop computer, a monitor, an automatic teller machine (ATM) for banking, etc.

For such a display device, the viewing angle characteristic is very important.

This display device will have to realize clear and distortion-free image quality even in a range of wide viewing angle. As such, continuous development on the technology for wide viewing angle has been recently made in the art.

However, in case a user desires that information displayed on a screen of his/her display device is not viewed to others located right nearby, the user may demand to utilize a wide viewing angle mode (e.g., normal mode) as well as a narrow viewing angle mode (e.g., privacy mode), which enables only the person sitting in front of the screen to view the image displayed on the screen, for ensuring the privacy of the user, in particular, when working with a confidential document or performing a certain task that requires security.

SUMMARY

Accordingly, the disclosure relate to a display device having switchable viewing angle, with a structure capable of using a photochromic layer to switch between a normal mode and a privacy mode, and in particular, implementing a narrow viewing angle state in the privacy mode.

Further, disclosure relates to a light control film without external appearance defects and a display device having switchable viewing angle including the same.

According to an aspect, the present disclosure provides a display device having switchable viewing angle, includes a display panel including a first emission area, a second emission area, a third emission area and a fourth emission area, from which light in different wavelength bands is emitted, and a transparent photochromic layer disposed on at least one surface of the display panel, wherein at least one emission area of the first emission area, the second emission area, the third emission area and the fourth emission area emits light in a wavelength band of ultraviolet ray, wherein when light is emitted from the first emission area, the second emission area, the third emission area and the fourth emission area, a partial area of the photochromic layer including an area corresponding to the emission area, from which the light in the wavelength band of ultraviolet ray is emitted, is an opaque area.

According to another aspect, the present disclosure provides a display device having switchable viewing angle, comprising a display panel including a first emission area, a second emission area, a third emission area and a fourth emission area, from which light in different wavelength bands is emitted, and a transparent photochromic layer disposed on at least one surface of the display panel, wherein each of the first emission area, the second emission area and the third emission area emits light in a wavelength band of visible light, and the fourth emission area emits light in a wavelength band of ultraviolet ray, wherein when the fourth emission area is in an emission-state, an area of the photochromic layer including an area corresponding to the fourth emission area is an opaque area, and when the fourth emission area is in a non-emission state, an area of the photochromic layer including an area corresponding to the fourth emission area is a transparent area.

According to yet another aspect, the present disclosure provides a display device having switchable viewing angle includes a photochromic layer that is converted to a transparent state or an opaque state depending on a wavelength of incident light, in particular, capable of switching between a normal mode and a privacy mode and then implementing a narrow viewing angle state in the privacy mode.

According to a further aspect, the present disclosure provides a light control film without external appearance defects, and a display device having switchable viewing angle including the same, owing to having no viewing angle adjustment film with a louver.

DESCRIPTION OF DRAWINGS

FIG. 11 shows a diagram illustrating part of an active area in a display device having switchable viewing angle according to another aspect of the disclosure.

DETAILED DESCRIPTION

Figure 1:
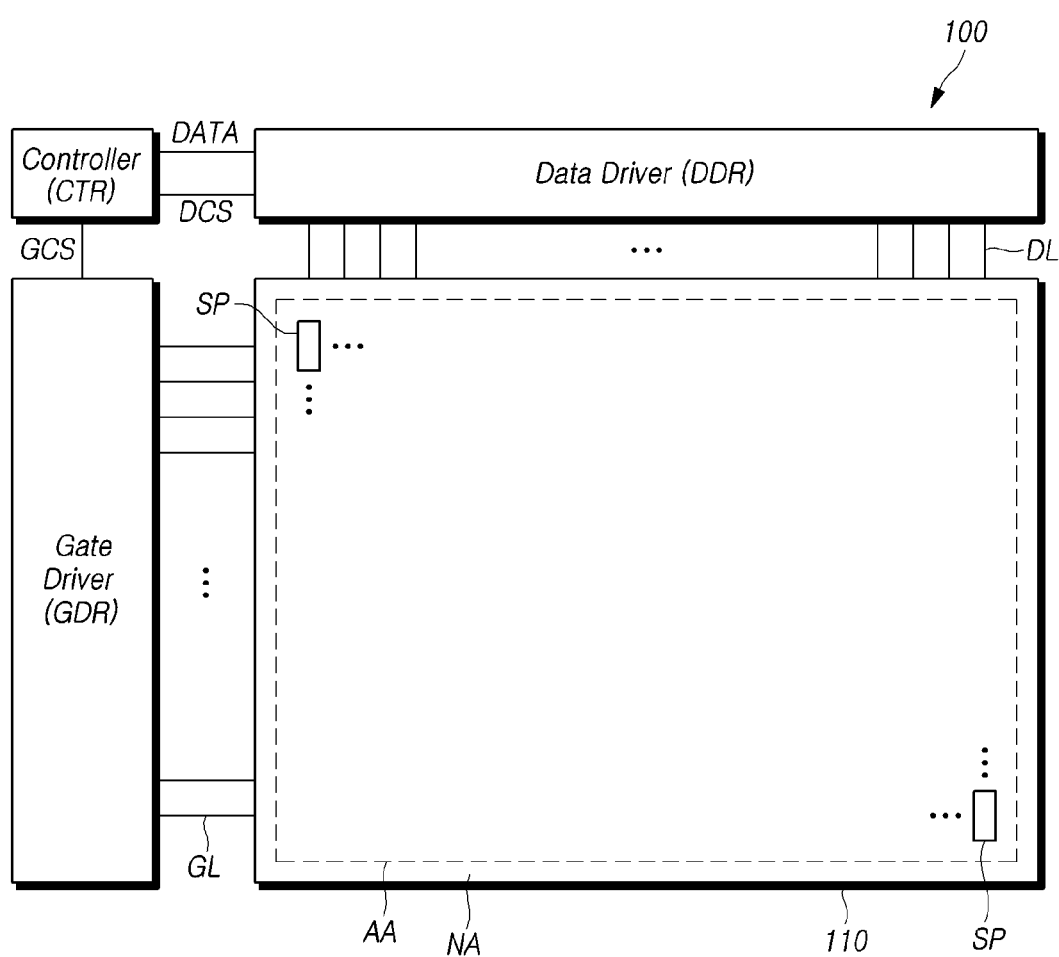
FIG. 1 shows a schematic system configuration diagram of a display device having switchable viewing angle according to aspects of the disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a schematic system configuration diagram of a display device having switchable viewing angle according to aspects of the disclosure.

A display device 100 having switchable viewing angles according to aspects of the disclosure may include a display device, a lighting device, a emission device, and the like. Hereinafter, for convenience of description, the display device 100 having switchable viewing angles will be generally described as a display device for displaying an image. However, so long as it includes a transistor(s), the same may be applied to other various display devices having switchable viewing angles such as e.g., a lighting device, a light emission device or the like, as well as the display device 100.

The display device 100 having switchable viewing angles according to the aspects of the disclosure may include a display panel 110 for displaying an image or outputting light, and a driving circuit for driving the display panel 110.

Further, the display device 100 having switchable viewing angles according to the aspects of the disclosure may be a bottom emission type of display device in which light is emitted in a direction toward a substrate on which a light emitting element is disposed, although not limited thereto. In some cases, the display device 100 having switchable viewing angles of the disclosure may be of a top emission type in which light is emitted to a surface opposite to the substrate on which a light emitting element is disposed, or of a double-sided emission type in which light is emitted to both the direction toward the substrate and the direction towards a surface opposite to the substrate.

A plurality of data lines DL and a plurality of gate lines GL may be arranged in the display panel 110, and a plurality of sub-pixels SP defined by the plurality of data lines DL and the plurality of gate lines GL may be arranged in a matrix type.

In the display panel 110, the plurality of data lines DL and the plurality of gate lines GL may be disposed to cross each other. For example, the plurality of gate lines GL may be arranged in rows or columns, and the plurality of data lines DL may be arranged in columns or rows. Hereinafter, for convenience of description, it is assumed that the plurality of gate lines GL are arranged in rows and the plurality of data lines DL are arranged in columns.

In addition to the plurality of data lines DL and the plurality of gate lines GL, other types of signal lines may be arranged in the display panel 110 according to a sub-pixel structure or the like. A driving voltage wiring, a reference voltage wiring, a common voltage wiring and so on may be further disposed.

The type of signal lines disposed in the display panel 110 may vary depending on the sub-pixel structure and so on. Further, throughout this specification, the signal lines may be of a concept encompassing electrodes to which a signal is applied.

The display panel 110 may include an active area AA on which an image (picture) is displayed, and a non-active area NA, outside the active area, on which no image is displayed. Here, the non-active area NA may be also referred to as a bezel area.

In the active area AA A may be disposed a plurality of sub-pixels SP for image display.

In the non-active area NA may be disposed a pad portion for electrically connecting a data driver DDR, and a plurality of data link lines may disposed for connection between the pad portion and the plurality of data lines DL. Here, the plurality of data link lines may be extended portions of the plurality of data lines DL to the non-active area NA or separate patterns electrically connected to the plurality of data lines DL.

Further, in the non-active area NA may be disposed gate driving-related wirings for transferring a voltage (signal) necessary for gate driving, to a gate driver GDR, through the pad portion to which the data driver DDR is electrically connected. For example, the gate driving-related wirings may include clock wirings for transmitting a clock signal, gate voltage wirings for transmitting gate voltages (VGH, VGL), gate driving control signal wirings for transmitting various control signals necessary for generating a scan signal and the like. These gate driving-related wirings may be disposed in the non-active area NA, unlike the gate lines GL disposed in the active area AA.

The driving circuit may include a data driver DDR for driving a plurality of data lines DL, a gate driver GDR for driving a plurality of gate lines GL, a controller CTR for controlling the data driver DDR and the gate driver GDR, and so on.

The data driver DDR may serve to drive the plurality of data lines DL by outputting a data voltage to the plurality of data lines DL.

The gate driver GDR may serve to drive the plurality of gate lines GL by outputting a scan signal to the plurality of gate lines GL.

The controller CTR may supply various control signals DCS and GCS necessary for driving operations of the data driver DDR and the gate driver GDR to control the operations of the data driver DDR and the gate driver GDR. Further, the controller CTR may supply the image data DATA to the data driver DDR.

The controller CTR may operate to start scanning according to the timing implemented in each frame, convert the image data input from the outside complying to a data signal format used by the data driver (DDR) to output the converted image data DATA, and control the data driving at an appropriate timing point in compliance with the scanning.

In order to control the data driver DDR and the gate driver GDR, the controller CTR may receive a vertical synchronization signal Vsync, a horizontal synchronization signal Hsync, an input data enable (DE: Data Enable) signal, clock signal CLK, and so on, from an external device (e.g., host system) to generate various control signals, for outputting to the data driver DDR and the gate driver GDR.

For example, in order to control the gate driver GDR, the controller CTR may output various gate control signals GCS including a gate start pulse GSP, a gate shift clock GSC, a gate output enable signal GOE and the like.

Further, in order to control the data driver DDR, the controller CTR may output various data control signals (DCS) including a source start pulse (SSP), a source sampling clock (SSC), a source output enable signal (SOE), and so on.

The controller CTR may be a timing controller used in a conventional display technology or a controller capable of further performing other control functions including the timing controller.

The controller CTR may be implemented as a separate component from the data driver DDR, or may be implemented as an integrated circuit with the data driver DDR.

The data driver DDR may receive the image data DATA from the controller CTR and supply a data voltage to the plurality of data lines DL to drive the plurality of data lines DL. Here, the data driver DDR may be also referred to as a source driver.

The data driver (DDR) may exchange various signals with the controller CTR through various interfaces.

The gate driver GDR may sequentially supply scan signals to the plurality of gate lines GL to drive the plurality of gate lines GL in sequence. Here, the gate driver GDR may be also referred to as a scan driver.

The gate driver GDR may sequentially supply a scan signal of on/off voltage to the plurality of gate lines GL under the control of the controller CTR.

When a specific gate line is opened by the gate driver GDR, the data driver DDR may convert the image data DATA received from the controller CTR into an analog data voltage for supplying to the plurality of data lines DL.

The data driver DDR may be located only on one side (e.g., either top or bottom side) of the display panel 110, and in some cases, it may be located on both sides (e.g., top and bottom) of the display panel 110, according to a driving method, a display panel design, or the like.

The gate driver GDR may be located only on one side (e.g., either left or right) of the display panel 110, and in some cases, may be located on both sides (e.g., left and right) of the display panel 110, according to a driving method, a display panel design method, or the like.

The data driver DDR may be implemented with at least one source driver integrated circuit SDIC.

Each source driver integrated circuit SDIC may include a shift register, a latch circuit, a digital-to-analog converter (DAC), an output buffer, and the like. The data driver DDR may further include at least one analog-to-digital converter (ADC) as circumstance demands.

Each source driver integrated circuit SDIC may be connected to a bonding pad of the display panel 110 in either TAB (Tape Automated Bonding) type or COG (Chip-On-Glass) type or may be placed directly onto the display panel 110. In some cases, each source driver integrated circuit SDIC may be integrated with the display panel 110 and disposed therein. Further, each source driver integrated circuit SDIC may be implemented as COF (Chip-On-Film) type. In this case, each source driver integrated circuit SDIC may be mounted on a circuit film to be electrically connected to the data lines DL of the display panel 110 via the circuit film.

The gate driver GDR may include a plurality of gate driving circuits GDC. Here, the plurality of gate driving circuits GDC may respectively correspond to the plurality of gate lines GL.

Each gate driving circuit GDC may include a shift register, a level shifter, and the like.

Each gate driving circuit GDC may be connected to a bonding pad of the display panel 110 in either TAB (Tape Automated Bonding) type or a COG (Chip-On-Glass) type. Further, each gate driving circuit GDC may be implemented in a COF (Chip-On-Film) method. In this case, each gate driving circuit GDC may be mounted on a circuit film to be electrically connected to the gate lines GL in the display panel 110 through the circuit film. Further, each gate driving circuit GDC may be implemented as GIP (Gate In Panel) type to be embedded in the display panel 110. That is, each gate driving circuit GDC may be directly formed on the display panel 110.

The plurality of gate lines GL disposed on the display panel 110 may include a plurality of scan lines SCL, a plurality of sense lines SCL, and a plurality of light emission control lines EML. The scan line SCL, the sense line SCL and the light emission control line EML are wirings to transmit different types of gate signals (e.g., scan signal, sense signal and light emission control signal) to gate nodes of different types of transistors (e.g., scan transistor, sense transistor and light emission control transistor). Hereinafter, description will be made with reference to FIG. 2.

Figure 2:
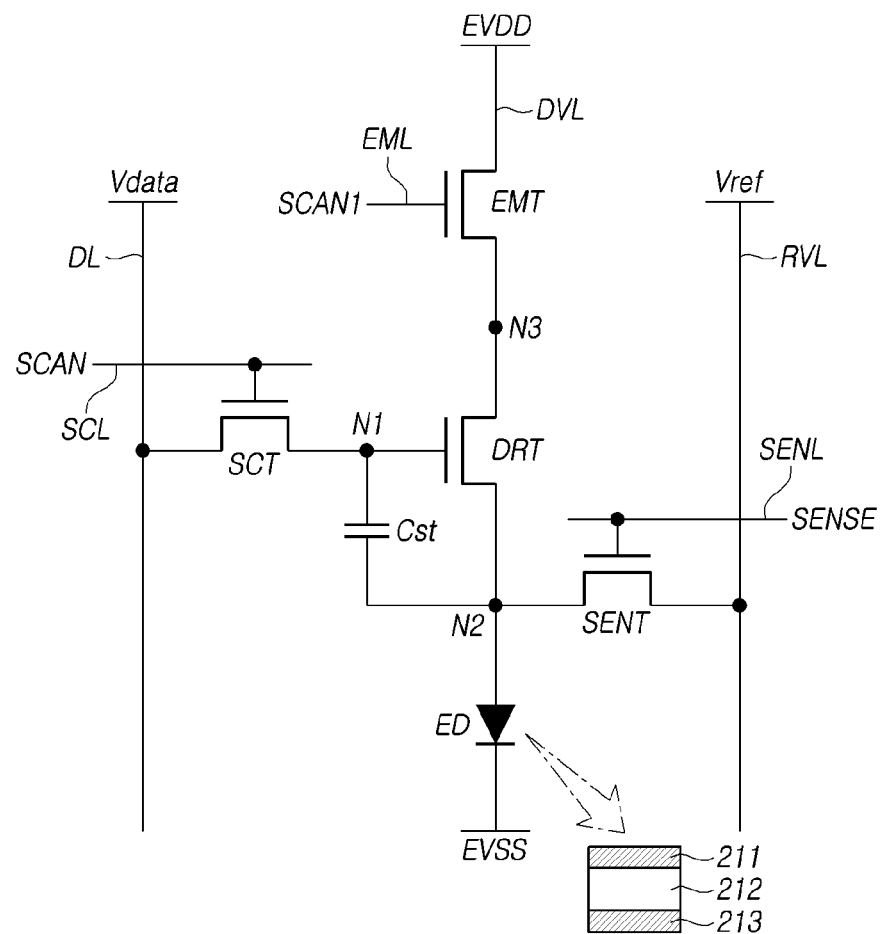
FIG. 2 shows an equivalent circuit of a sub-pixel of a display device having switchable viewing angle according to aspects of the disclosure.

FIG. 2 shows an equivalent circuit diagram of a sub-pixel of a display device having switchable viewing angle according to aspects of the disclosure.

Referring then to FIG. 2, each sub-pixel SP of the display device 100 having switchable viewing angles according to the aspects of the disclosure, may include a emission device ED, a driving transistor DRT for controlling a current flowing through the emission device ED, a scan transistor SCT for transferring a data voltage Vdata to the driving transistor DRT, a sense transistor SENT for an initialization operation, an emission control transistor EMT for controlling light emission, a storage capacitor Cst for maintaining a voltage for a certain period of time, and the like.

The emission device ED may include a first electrode 211 and a second electrode 213, and an emission layer 212 positioned between the first electrode 211 and the second electrode 213. The first electrode 211 of the emission device ED may be either an anode electrode or a cathode electrode, and the second electrode 213 may be either a cathode electrode or an anode electrode. The emission device ED may be, for example, an organic light emitting diode (OLED), a light emitting diode (LED), or a quantum dot emission device (QLED).

The second electrode 213 of the emission device ED may be a common electrode. In this case, a base voltage EVSS may be applied to the second electrode 213 of the emission device ED. Here, the base voltage EVSS may be, for example, a ground voltage or a voltage similar to the ground voltage.

The driving transistor DRT may be a transistor for driving the emission device ED and include a first node N1, a second node N2, and a third node N3.

The first node N1 of the driving transistor DRT may be a node corresponding to a gate node, and may be electrically connected to a source node or a drain node of the scan transistor SCT. The second node N2 of the driving transistor DRT may be electrically connected to the first electrode 211 of the emission device ED, and may be a source node or a drain node. The third node N3 of the driving transistor DRT may be a node to which a driving voltage EVDD is applied, and may be electrically connected to a driving voltage line DVL that supplies the driving voltage EVDD, which node may be either a drain node or a source node. Hereinafter, for convenience of description, description will be made, for example, with the second node N2 of the driving transistor DRT being a source node and the third node N3 being a drain node.

The scan transistor SCT may control connection between the first node N1 of the driving transistor DRT and a corresponding data line DL of the plurality of data lines DL, in response to a scan signal SCAN supplied from a corresponding scan line SCL of a plurality of scan lines SCL, which is a kind of the gate line GL.

A drain node or a source node of the scan transistor SCT may be electrically connected to the corresponding data line DL. A source node or a drain node of the scan transistor SCT may be electrically connected to the first node N1 of the driving transistor DRT. A gate node of the scan transistor SCT may be electrically connected to the scan line SCL, which is a sort of the gate line GL, to receive the scan signal SCAN.

The scan transistor SCT may be turned on by the scan signal SCAN of a turn-on level voltage to transfer the data voltage Vdata supplied from the corresponding data line DL to the first node N1 of the driving transistor DRT.

The scan transistor SCT may be turned on by the scan signal SCAN of the turn-on level voltage, and may be turned off by the scan signal SCAN of a turn-off level voltage. Here, when the scan transistor SCT is of an n-type, the turn-on level voltage may be a high-level voltage, and the turn-off level voltage may be a low-level voltage. When the scan transistor SCT is a p-type, the turn-on level voltage may be a low-level voltage and the turn-off level voltage may be a high-level voltage.

The sense transistor SENT may control connection between the second node N2 of the driving transistor DRT electrically connected to the first electrode 211 of the emission device ED and a corresponding reference line RVL of a plurality of reference lines RVL, in response to a sense signal SENSE supplied from a corresponding sense line SENL of a plurality of sense lines SENL, which is a kind of the gate line GL.

A drain node or a source node of the sense transistor SENT may be electrically connected to the reference line RVL. A source node or a drain node of the sense transistor SENT may be electrically connected to the second node N2 of the driving transistor DRT, and may be electrically connected to the first electrode 211 of the emission device ED. A gate node of the sense transistor SENT may be electrically connected to the sense line SENL, which is a kind of the gate line GL, to receive the sense signal SENSE.

The sense transistor SENT may be turned on to apply a reference voltage Vref supplied from the reference line RVL to the second node N2 of the driving transistor DRT.

The sense transistor SENT may be turned on by the sense signal SENSE of the turn-on level voltage, and may be turned off by the sense signal SENSE of the turn-off level voltage. Here, when the sense transistor SENT is of an n-type, the turn-on level voltage may be a high-level voltage, and the turn-off level voltage may be a low-level voltage. On the other hand, when the sense transistor SENT is of a p-type, the turn-on level voltage may be a low-level voltage and the turn-off level voltage may be a high-level voltage.

The emission control transistor EMT may control connection between the third node N3 of the driving transistor DRT and a corresponding driving line DVL of a plurality of driving lines DVL, in response to an emission control signal EM supplied from a corresponding emission control line EML of a plurality of emission control lines EML, which is a kind of the gate line GL. In other words, as shown in FIG. 2, the emission control transistor EMT may be electrically connected between the third node N3 of the driving transistor DRT and the driving line DVL.

A drain node or a source node of the emission control transistor EMT may be electrically connected to the driving line DVL. A source node or a drain node of the emission control transistor EMT may be electrically connected to the third node N3 of the driving transistor DRT. A gate node of the emission control transistor EMT may be electrically connected to the emission control line EML, which is a kind of the gate line GL, to receive the emission control signal EM.

On the contrary to the above, the emission control transistor EMT may control connection between the second node N2 of the driving transistor DRT and the first electrode 211 of the emission device ED. In other words, differently from FIG. 2, the emission control transistor EMT may be electrically connected between the second node N2 of the driving transistor DRT and the emission device ED.

The emission control transistor EMT may be turned on by the emission control signal EM of the turn-on level voltage, and may be turned off by the emission control signal EM of the turn-off level voltage. Here, when the emission control transistor EMT is of an n-type, the turn-on level voltage may be a high-level voltage, and the turn-off level voltage may be a low-level voltage. Then, when the emission control transistor EMT is of a p-type, the turn-on level voltage may be a low-level voltage and the turn-off level voltage may be a high-level voltage.

The storage capacitor Cst may be electrically connected between the first node N1 and the second node N2 of the driving transistor DRT, to maintain a data voltage Vdata corresponding to the image signal voltage or a voltage corresponding thereto for one frame time duration.

The storage capacitor Cst may be an external capacitor intentionally designed outside the driving transistor DRT, other than a parasitic capacitor (e.g., Cgs, Cgd) that is an internal capacitor existing between the first node N1 and the second node N2 of the driving transistor DRT.

Each of the driving transistor DRT, the scan transistor SCT, the sense transistor SENT, and the emission control transistor EMT may be either an n-type transistor or a p-type transistor. The driving transistor DRT, the scan transistor SCT, the sense transistor SENT, and the emission control transistor EMT may all be either n-type transistors or p-type transistors. At least one of the driving transistor DRT, the scan transistor SCT, the sense transistor SENT, and the emission control transistor EMT may be an n-type transistor (or p-type transistor), and the other may be a p-type transistor (or n-type transistor).

A respective subpixel structure illustrated in FIG. 2 is only an example for convenience of description, and it may further include one or more transistors or, in some cases, one or more capacitors. Alternatively, each of the plurality of sub-pixels may have the same structure, and some of the plurality of sub-pixels may have a different structure.

Further, each subpixel SP may have a structure including a emission device ED, a driving transistor DRT, a scan transistor SCT, a sense transistor SENT, and a storage capacitor Cst.

Further, each subpixel SP may have a structure including a emission device ED, a driving transistor DRT, a scan transistor SCT, and a storage capacitor Cst.

The display device 100 having switchable viewing angles according to aspects of the disclosure can effectively implement both a privacy mode (e.g., a narrow viewing angle mode) and a normal mode (e.g., a wide viewing angle mode) through a photochromic layer disposed on at least one surface of the display panel 110.

Hereinafter, further description on the foregoing structure will be made with reference to related drawings.

Figure 3:
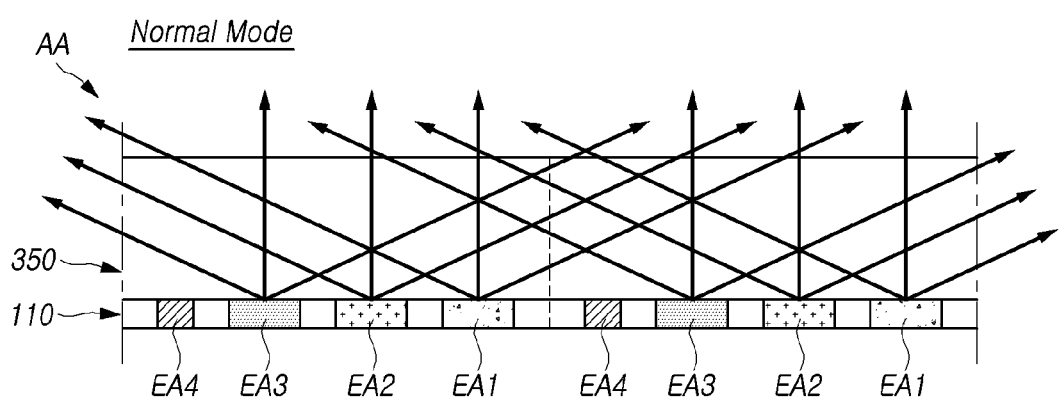
FIG. 3 shows a schematic diagram illustrating an arrangement that a display device having switchable viewing angle according to aspects of the disclosure is in a normal mode.

FIG. 3 shows a schematic diagram illustrating a structure that a display device having switchable viewing angle according to aspects of the disclosure is in a normal mode. Further, FIG. 4 shows a schematic diagram illustrating another structure that a display device having switchable viewing angle according to aspects of the disclosure is in a privacy mode.

Figure 4:
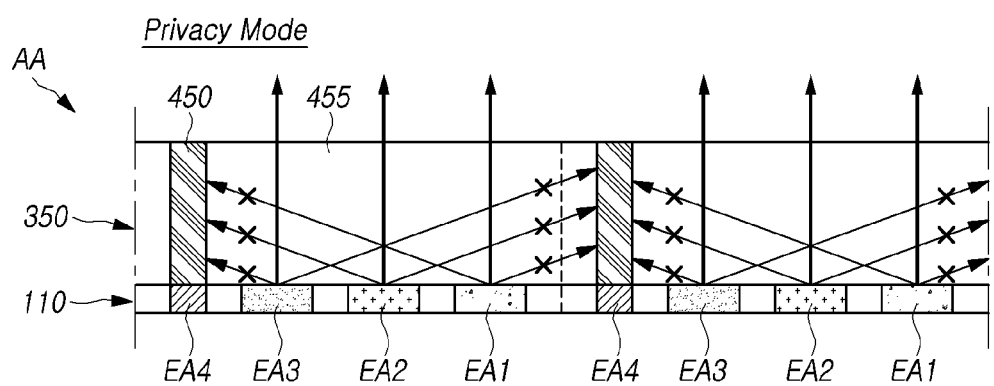
FIG. 4 shows a schematic diagram illustrating another arrangement that a display device having switchable viewing angle according to aspects of the disclosure is in a privacy mode.

For convenience of description, following description will focus on an active area AA of the display device 100 having switchable viewing angles, with reference to FIGS. 3 and 4.

Referring then to FIGS. 3 and 4, the display device 100 having switchable viewing angles according to aspects of the disclosure may include a display panel 110 and a photochromic layer 350.

The photochromic layer 350 may be disposed on at least one side surface of the display panel 110 of the display device 100 having switchable viewing angles.

For example, as shown in FIGS. 3 and 4, the photochromic layer 350 may be disposed on a top surface of the display panel 110.

However, a structure of the display device 100 having switchable viewing angles according to aspects of the disclosure is not limited to the aforementioned, and the photochromic layer 350 may be disposed underneath the display panel 110 or on the uppermost surface and the lowermost surface of the display panel 110, respectively.

Specifically, the photochromic layer 350 of the display device 100 having switchable viewing angles according to the aspects of the disclosure will suffice if it has a structure disposed in the direction in which light is emitted from the display panel 110.

In the following description, description will focus on a structure that the display panel 110 of the display device 100 having switchable viewing angles according to aspects of the disclosure is composed of a top emission type of an organic light emitting display device.

As shown in FIG. 3, when the display device 100 having switchable viewing angles is in the normal mode, the light emitted from the display panel 110 is diffused in various directions, passing through the photochromic layer 350, so that a viewer looking at the display device 100 having switchable viewing angles can see clear image from various directions.

More specifically, the display panel 110 may include a plurality of emission areas EA1, EA2, EA3 and EA4 in the active area AA. Further, when the display device 100 having switchable viewing angles is in the normal mode, only some of the plurality of emission areas EA1, EA2, EA3, and EA4 may emit light.

An organic emission device or an LED device may be disposed in the plurality of emission areas EA1, EA2, EA3 and EA4.

As shown in FIG. 3, the active area AA of the display panel 110 may include a first emission area EA1, a second emission area EA2, a third emission area and a fourth emission area EA4, each emitting light in different wavelength bands. Further, at least one of the first to fourth emitting areas EA1, EA2, EA3 and EA4 may emit light in a wavelength band of ultraviolet rays.

For example, each of the first to third emission areas EA1, EA2 and EA3 may emit light in a wavelength band of visible light, and the fourth emission area EA4 may emit light in a wavelength band of ultraviolet ray (e.g., wavelength of no less than 100 nm and less than 380 nm). Here, light in a red (R) wavelength band is emitted from the first emission area EA1, light in a green (G) wavelength band is emitted from the second emission area EA2, and light in a blue (B) wavelength band is emitted from the third emission area EA3. However, although the disclosure is not limited thereto.

At least one organic emission device (OLED) may be disposed in each of the first to third emission areas EA1, EA2, and EA3, and at least one organic emission device or an LED device may be disposed in the fourth emission area EA4, although the disclosure is not limited thereto.

When the display device 100 having switchable viewing angles is in the normal mode, light may be emitted from each of the first to third emission areas EA1, EA2 and EA3 of the display panel 110. Further, no light may be emitted from the fourth emission area EA4.

Further, the photochromic layer 350 may maintain a transparent state throughout the entire area corresponding to the display panel 110.

Accordingly, the light from the display panel 110 is emitted to the outside of the display device 100 having switchable viewing angles, through the photochromic layer 350, so as to emit the light with an angle perpendicular to a surface of the photochromic layer 350 as well as the light with various angles to obtain the effect of a wide viewing angle. As such, it is possible to obtain display information, for example, at an angle range of about +85° to −85° (angle with respect to the surface of the photochromic layer 350). However, it should be noted that the above range of the viewing angle is only one example in case the display device 100 having switchable viewing angles of the disclosure is in the normal mode, is only an example.

Further, as shown in FIG. 4, when the display device 100 having switchable viewing angles is in the privacy mode, some of the light emitted from the display panel 110 is caused to be emitted to the outside through the photochromic layer 350, while other portion of the light emitted from the display panel 110 may be absorbed into a photochromic area of the photochromic layer 350.

More specifically, when the display device 100 having switchable viewing angles is in the privacy mode, all of the first to fourth emission areas EA1, EA2, EA3, and EA4 may be in a light emitting state.

In other words, when the display device 100 having switchable viewing angles is in the privacy mode, the light is caused to emit from the first to third emission areas EA1, EA2, EA3 emitting in the wavelength band of visible light and the fourth emission area EA4 emitting in the wavelength band of ultraviolet ray, so that the light can be incident on the photochromic layer 350.

The photochromic layer 350 may include a material that is changed from a transparent state to an opaque state when light in the wavelength band of ultraviolet ray is incident.

The photochromic layer 350 may include a geometric isomer (or cis-trans isomer) material. The material included in the photochromic layer 350 may be a material including a double bond. For example, when the photochromic layer 350 includes cis isomer, it may include cis-azobenzene and, when the photochromic layer 350 includes trans isomer, it may include trans-azobenzene, but the disclosure is not limited thereto.

When light in a wavelength band of visible light is incident on the photochromic layer 350, the material included in the photochromic layer 350 may maintain a trans-type, thereby maintaining the transparency.

Further, when light in the wavelength band of ultraviolet ray is incident on the photochromic layer 350, the material included in the photochromic layer 350 may be converted into a cis-type to exhibit an opaque color. Furthermore, when light in the wavelength band of ultraviolet ray incident on the photochromic layer 350 is removed, the photochromic layer 350 may return back to a transparent state.

Accordingly, the area of the color-changing layer 350 on which the light generated from the fourth emission area EA4 is incident may change to an opaque state. For example, a portion of the photochromic layer 350 including an area corresponding to the fourth emission area EA4 may change to an opaque state. As such, when light is emitted from the fourth emission area EA4 to be incident on the photochromic layer 350, the photochromic layer 350 may include an opaque area 450 and a transparent area 455.

When the photochromic layer 350 includes both the opaque area 450 and the transparent area 455, some of the light emitted from the first to third emission areas EA1, EA2 and EA3 may be emitted to the outside via the transparent area 455 of the photochromic layer 350, and the remaining portion thereof may be absorbed into the opaque area 450 of the photochromic layer 350.

Further, the whole of the light emitted from the fourth emission area EA4 may be absorbed into the opaque area 450 of the photochromic layer 350.

Specifically, among the light emitted from the first to third emission areas EA1, EA2 and EA3 of the display panel 110, the light emitted in the front direction of the display device 100 having switchable viewing angles may be transmitted to the outside of the display device 100 having switchable viewing angles via the transparent area 455 of the photochromic layer 350.

Further, the light emitted in the lateral direction of the display device 100 having switchable viewing angles of the light generated in the first to third emission areas EA1, EA2 and EA3 of the display panel 110 may be absorbed into the opaque area 450 of the photochromic layer 350. Here, the lateral direction of the display device 100 having switchable viewing angles may mean any other direction except for the direction perpendicular to the surface of the photochromic layer 350.

Accordingly, when the display device 100 having switchable viewing angles is in the privacy mode, the light from the display panel 100 is emitted in the front direction of the display device 100 having switchable viewing angles, so that only a viewer in the front direction of the display device 100 having switchable viewing angles can see a clear image.

Further, the light generated in the fourth emission area EA4 may be absorbed into the opaque area 450 of the photochromic layer 350, so as to prevent the light in the wavelength band of ultraviolet ray from being recognized by the viewer.

In the meantime, although it is shown in FIGS. 3 and 4 that each of the first to third emission areas EA1, EA2 and EA3 emits light in the wavelength band of visible light, and the fourth emission area EA4 emits light in the wavelength band of ultraviolet ray, the structure of the display device 100 having switchable viewing angles according to the aspects of the disclosure is not limited thereto, and then, two or three of the first to fourth emission areas EA1, EA2, EA3 and EA4 may emit light in an wavelength band of ultraviolet ray, and the remaining emission area may emit light in the wavelength band of visible light.

That is to say, the display device 100 having switchable viewing angles according to aspects of the disclosure can provide switching between the privacy mode and the normal mode, using the emission area that emits light in the wavelength band of ultraviolet ray.

The operation will be explained in further detail through the following description.

Figure 5:
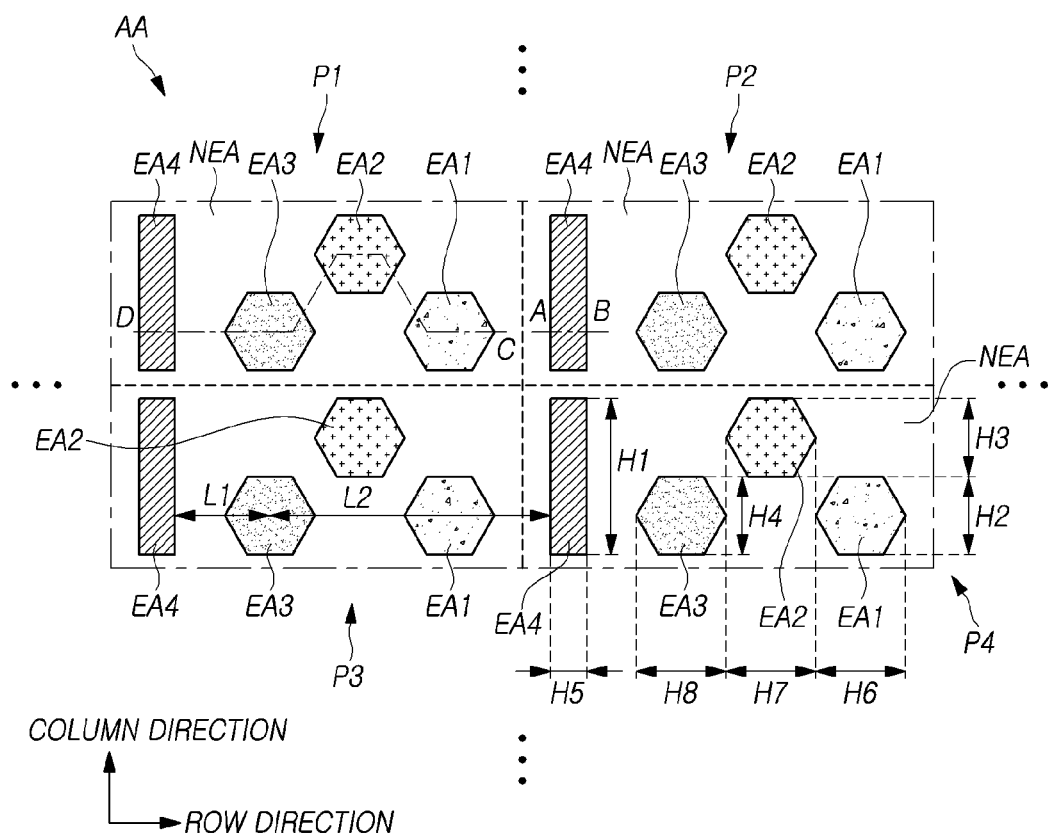
FIG. 5 shows a diagram illustrating part of an active area in a display device having switchable viewing angle according to aspects of the disclosure.

FIG. 5 is a diagram illustrating part of an active area of a display device having switchable viewing angle according to aspects of the disclosure.

Referring now to FIG. 5, the display device 100 having switchable viewing angles according to aspects of the disclosure may include an active area AA.

The active area AA may include a plurality of pixels P1, P2, P3, and P4. Each of the plurality of pixels P1, P2, P3, and P4 may include a plurality of emission areas EA1, EA2, EA3, and EA4.

For example, each of the plurality of pixels P1, P2, P3, and P4 may include a first emission area EA1, a second emission area EA2, a third emission area EA3, and a fourth emission area EA4).

Although not shown in FIG. 5, the first emission area EA1 may include a first emission device, the second emission area EA2 may include a second emission device, the third emission area EA3 may include a third emission device, and the fourth emission area EA4 may include a fourth emission device.

Here, light in the red (R) wavelength band may be emitted from the first emission area EA1, light in the green (G) wavelength band may be emitted from the second emission area EA2, light in the blue (B) wavelength band may be emitted from the third emission area EA3, and light in the wavelength band of ultraviolet ray may be emitted from the fourth emission area EA4.

As shown in FIG. 5, the fourth emission area EA4 may be disposed on at least one side of the first to third emission areas EA1, EA2, and EA3. For example, in each pixel, the fourth emission area EA4 may be disposed on the leftmost side of each of the first to third emission areas EA1, EA2 and EA3, in a plan view.

With such a structure, it is possible to obtain an effect that the fourth emission area EA4 is arranged on the leftmost and rightmost sides of the first to third emission areas EA1, EA2 and EA3 included in at least one pixel.

For example, on the leftmost side of each of the first to third emission areas EA1, EA2 and EA3 included in the first pixel P1 may be arranged the fourth emission area EA4 included in the first pixel P1, and on the rightmost side of each of the first to third emission areas EA1, EA2 and EA3 included in the first pixel P1 may be arranged the fourth emission area EA4 included in a second pixel P2 disposed in a row direction from the first pixel P1. Accordingly, the fourth emission area EA4 may be disposed on both the left and right sides of the first to third emission areas EA1, EA2 and EA3 included in at least one pixel.

Throughout the description of the disclosure, such an arrangement that the fourth emission area EA4 is disposed on the leftmost side of the first to third emission areas EA1, EA2, and EA3 means that the fourth emission area EA4 of the first to fourth emission areas EA1, EA2, EA3, and EA4 is located at the leftmost side with respect to the row direction. Further, the arrangement that the fourth emission area EA4 is disposed on the rightmost side of the first to third emission areas EA1, EA2 and EA3 means that the fourth emission area EA4 of the first to fourth emission areas EA1, EA2, EA3 and EA4 is located at the rightmost side with respect to the row direction.

When the fourth emission area EA4 is disposed on the leftmost side of each of the first to third emission areas EA1, EA2, and EA3, a distance between the center of at least one emission area emitting light in the wavelength band of visible light of the emission areas disposed in the active area AA and the fourth emission area EA4 disposed on the leftmost side may be different from a distance between the center of at least one emission area emitting light in the wavelength band of visible light of the emission areas disposed in the active area AA and the fourth emission area EA4 disposed on the rightmost side.

For example, a first distance L1 between the third emission area EA3 disposed in the third pixel P3 of FIG. 5 and the fourth emission area EA4 (i.e., the fourth emission area disposed in a third pixel) disposed on the leftmost side of the third emission area EA3 may be shorter than a second distance L2 between the third emission area EA3 disposed in the third pixel P3 and the fourth emission area EA4 (i.e., the fourth emission area disposed in a fourth pixel adjacent to the third pixel in the row direction) disposed on the rightmost side of the third emission area EA3.

Here, the first distance L1 and the second distance L2 may be of lengths based on the row direction, and the row direction may be a direction corresponding to the extending direction of the gate line in FIG. 1.

Meanwhile, as shown in FIG. 4, when the display device 100 having switchable viewing angles is in the privacy mode, light emitted in a direction that is not perpendicular to a surface of the photochromic layer 350 of the light emitted from the third emission area EA3 may be absorbed into the opaque area 450 of the photochromic layer 350 formed due to the fourth emission area EA4 disposed on the left and right sides of the third emission area EA3.

Accordingly, although the distance between the center of at least one emission area emitting light in the wavelength band of visible light of the emission areas disposed in the active area AA and the fourth emission area EA4 disposed on the leftmost side thereof might be different from the distance the distance between the center of at least one emission area emitting light in the wavelength band of visible light of the emission areas disposed in the active area AA and the fourth emission area EA4 disposed on the rightmost side thereof, the display device 100 having switchable viewing angles can effectively implement a narrow viewing angle state when it is in the privacy mode.

In the foregoing description, the distance between the third emission area EA3 and the fourth emission area EA4 has been described as an example, but the distance between the four emission areas EA4 arranged on the leftmost and rightmost sides of the first emission area EA1 based on the row direction may be different from each other and the distance between the fourth emission areas EA4 disposed on the leftmost and rightmost sides of the second emission area EA2 may be different from each other.

Further, as described above, when the display device 100 having switchable viewing angles is in the privacy mode, the photochromic layer 350 in an area corresponding to the fourth emission area EA4 may be switched to the opaque area 450, so the light emitted in a direction other than the front direction of the display device 100 having switchable viewing angles of the light emitted from the display panel 110 may be absorbed into the opaque area 450 of the photochromic layer 350 so as that it cannot be emitted to the outside of the display device 100.

That is to say, in case where the fourth emission area EA4 is disposed on the leftmost and rightmost sides of the first to third emission areas EA1, EA2 and EA3 included in at least one pixel, as shown in FIG. 5, and the display device 100 having switchable viewing angles is in the privacy mode, the light directed to the left and right of each emission area of the light emitted from each of the first to third emission areas EA1, EA2, EA3 may be absorbed into the opaque area 450 of the photochromic layer 350 so that it cannot be emitted to the outside of the display. Accordingly, reducing the luminance in the left and right directions of the display device 100 having switchable viewing angles can implement a narrow viewing angle state as desired.

Further, when the display device 100 having switchable viewing angles is in the normal mode, no light is emitted from the fourth emission area EA4, so that the entire photochromic layer 350 may be in a transparent state. Accordingly, the light emitted from the first to third emission areas EA1, EA2 and EA3 may be transmitted to the outside of the display device 100 having switchable viewing angles in various directions, thereby making it possible to implement a wide viewing angle state.

In the above description, it has been described with a focus on the structure of the fourth emission area EA4 disposed on the left side of each of the first to third emission areas EA1, EA2, and EA3, in each pixel, but the disclosure is not limited thereto, and the fourth emission area EA4 may be disposed on the right side of each of the first to third emission areas EA1, EA2, and EA3.

Even in this case, it is possible to obtain the effect of arranging the fourth emission area EA4 onto both the left and right sides of the first to third emission areas EA1, EA2 and EA3 included in at least one pixel. Accordingly, when the display device 100 having switchable viewing angles is in the privacy mode, a narrow viewing angle state can be implemented by reducing the luminance of the display device 100 having switchable viewing angles in the left and right directions thereof.

Further, in a plan view, the shapes of the first to third emission areas EA1, EA2 and EA3 and the shape of the fourth emission areas EA4 may be different from each other. For example, the first to third emission areas EA1, EA2 and EA3 may have a hexagonal shape, while the fourth emission area EA4 may have a rectangular shape.

Therefore, the shapes of the emission areas according to the aspects of the disclosure are not limited thereto, and the shapes of the first to fourth emission areas EA1, EA2, EA3, and EA4 may formed to be, in a plan view, circular, oval, or polygonal, for example, such as a triangle, a square, or an octagon, or combinations thereof.

Further, although the structure of the first to third emission areas EA1, EA2 and EA3 with the same area is shown in FIG. 5, the disclosure is not limited thereto, and the first to third emission areas EA1, EA1 and EA3 each may have different areas in consideration of luminance and lifetime of the emission devices.

Meanwhile, in one pixel, the first to third emission areas EA1, EA2 and EA3 may be spaced apart from each other, and may be arranged in various shapes.

For example, as shown in FIG. 5, assuming that the second emission area EA2 is disposed in a first row, the first and third emission areas EA1 and EA3 may be disposed in a second row, which is a different row from the first row. Further, assuming that the first emission area EA1 is disposed in a first column, the second emission area EA2 may be disposed in a second column that is different from the first column, and the third emission area EA3 may be disposed in a third column that is a different column from the first and second columns.

However, the arrangement structure of the first to third emission areas EA1, EA2 and EA3 according to aspects of the disclosure is not limited thereto, and the first to third emission areas EA1, EA2, EA3 may be arranged in various ways such as e.g., in the same row and different column, or in the same column and in different row, or the like.

In the following description, for convenience of explanation, description will be made based on the arrangement that the second emission area EA2 is disposed in the first row, the first and third emission areas EA1 and EA3 are disposed in the second row, and the first to third emission areas EA1, EA2 and EA3 are disposed in different columns, as shown in FIG. 5. Here, the first row and the second row may indicate the direction in which the gate lines of FIG. 1 are arranged, and the first to third columns may indicate the direction in which the data lines of FIG. 1 are arranged.

Further, as shown in FIG. 5, when the fourth emission area EA4 is disposed on the left (or right) side of each of the first to third emission areas EA1, EA2 and EA3 in one pixel, a first length H1 of the fourth emission area EA4 in the column direction may be equal to or longer than the sum of a second length H2 of the first emission area EA1 in the column direction and a third length H3 of the second emission area EA2 in the column direction.

Further, the first length H1 of the fourth emission area EA4 in the column direction may be equal to or longer than the sum of the second length H2 of the second emission area EA1 in the column direction and a fourth lengths H4 of the third emission area EA3 in the column direction.

In other words, the first length H1 of the fourth emission area EA4 in the column direction may be equal to or longer than the sum of the lengths in the column direction of the emission area arranged in a different row of a plurality of emission areas emitting light in the wavelength band of visible light.

Here, when two or more emission areas are arranged in one row, a sum of the length in the column direction of the emission area having a longer length in the column direction and the length in the column direction of the emission area arranged in another row may be compared with the first length H1 of the fourth emission area EA4.

Here, each of the first to fourth lengths H1, H2, H3 and H4 in the column direction of respective emission areas may imply, in a plane view, the maximum length of the fourth emission area EA4 and the first to third emission areas EA1, EA2, and EA3.

When the first length H1 of the fourth emission area EA4 is shorter than the sum of the first length H1 of the first emission area EA1 and the second length H2 of the second emission area EA2 or less than the sum of the second length H2 of the second emission area EA2 and the third length H3 of the third emission area EA3, and the display device 100 having switchable viewing angles is in the privacy mode, some of the light emitted in a direction other than the direction perpendicular to the surface of the photochromic layer 350 of the light emitted from the first to third emission areas EA1, EA2, and EA3 cannot be absorbed, so that the luminance in the left and right directions may be reduced. Thus, it may be more or less difficult for the display device 100 having switchable viewing angles to implement a narrow viewing angle state.

Accordingly, when the fourth emission area EA4 is disposed on the leftmost side of the first to third emission areas EA1, EA2, and EA3, one fourth emission area EA4 in one pixel may be disposed to correspond to the entire left surface of each of the first to third emission areas EA1, EA2, and EA3.

Further, the fourth emission area EA4 may have a fifth length H5 in the row direction and each of the first to third emission areas EA1, EA2, and EA3 may have sixth to eighth lengths H6, H7, and H8 in the row direction.

When the fourth emission area EA4 is disposed on the left side of each of the first to third emission areas EA1, EA2, and EA3, the fifth length H5 of the fourth emission area EA4 may be shorter than at least one of the sixth to eighth lengths H6, H7, and H8 in the first to third emission areas EA1, EA2 and EA3.

Further, the fifth length H5 of the fourth emission area EA4 may be shorter than the first length H1 of the fourth emission area EA4. Accordingly, as the area of the fourth emission area EA4 in one pixel increases, the area occupied by the first to third emission areas EA1, EA2 and EA3 emitting light in the wavelength band of visible light can decrease, so that it can prevent the luminance characteristic of the display device 100 having switchable viewing angles from being deteriorated.

In the above description, each of the fifth to eighth lengths H5, H6, H7, and H8 that is the length in the row direction may indicate, in a plane view, the maximum length of the fourth emission area EA4 and the first to third emission areas EA1, EA2, and EA3, in the direction in which the gate line of FIG. 1 extends.

Although FIGS. 3 to 5 schematically illustrate the structure of the display device 100 having switchable viewing angles according to aspects of the disclosure, the display device 100 having switchable viewing angles according to aspects of the disclosure will be described in further detail through the following description.

Figure 6:
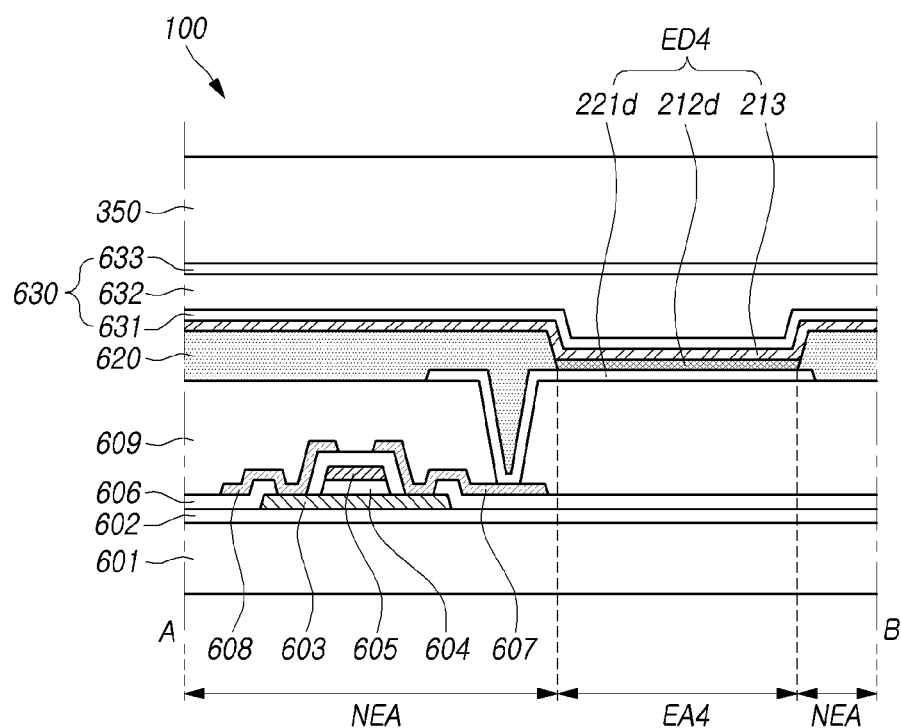
FIG. 6 shows a cross-sectional view taken along line A-B of FIG. 5.

FIG. 6 is a cross-sectional view taken along a line A-B of FIG. 5.

The area cut along the line A-B of FIG. 5 may be an area including the fourth emission area EA4 emitting light in the wavelength band of ultraviolet ray.

Referring now to FIG. 6, the display device 100 having switchable viewing angles according to aspects of the disclosure may include at least one thin film transistor disposed on a substrate 601, a fourth emission device ED4 disposed on the thin film transistor, and a photochromic layer 350 disposed on the fourth emission device ED4.

The thin film transistor may include an active layer 603, a gate electrode 605, a source electrode 607, and a drain electrode 608.

The fourth emission device ED4 may include a first electrode 211d, an emission layer 212d, and a second electrode 213.

Specifically, a buffer layer 602 may be disposed on the substrate 601.

The buffer layer 602 may include an inorganic insulating material such as e.g., silicon oxide (SiOx), silicon nitride (SiNx), silicon oxynitride (SiON) and the like, but the disclosure is not limited thereto.

Although FIG. 6 shows that the buffer layer 602 has a single-layer structure, the buffer layer 602 of the disclosure may have a multi-layer structure.

When the buffer layer 602 has a multi-layer structure, a layer including at least two of inorganic insulating materials, such as e.g., silicon oxide (SiOx), silicon nitride (SiNx), silicon oxynitride (SiON) or the like, may be arranged in an alternating manner, but the disclosure is not limited thereto.

In the following description, for convenience of description, description will be made, for example, on a structure of the buffer layer 602 with a single layer.

An active layer 603 of a thin film transistor may be disposed on the buffer layer 602.

The active layer 603 may be various types of semiconductor layers. For example, the active layer 303 may be selected from either one of an oxide semiconductor, an amorphous silicon semiconductor, or a polysilicon semiconductor, but the disclosure is not limited thereto.

A gate insulating layer 604 may be disposed on the active layer 603.

The gate insulating layer 604 may include an inorganic insulating material such as e.g., silicon oxide (SiOx), silicon nitride (SiNx), silicon oxynitride (SiON) or the like, but the disclosure is not limited thereto.

Although FIG. 6 illustrates a structure in which the gate insulating film 604 is disposed on part of an uppermost surface of the active layer 603, the disclosure is not limited thereto, and the gate insulating film 604 may be formed to cover the active layer 603.

A gate electrode 605 of the thin film transistor may be disposed on the gate insulating layer 604.

The gate electrode 605 may include any one of metal such as e.g., aluminum (Al), gold (Au), silver (Ag), copper (Cu), tungsten (W), molybdenum (Mo), chromium (Cr), tantalum (Ta), titanium (Ti) or the like, or an alloy thereof, but the disclosure is not limited thereto.

An interlayer insulating layer 606 may be disposed on the gate electrode 605.

The insulating interlayer 606 may include an inorganic insulating material such as e.g., silicon oxide (SiOx), silicon nitride (SiNx), silicon oxynitride (SiON), or the like, but the disclosure is not limited thereto.

A source electrode 607 and a drain electrode 608 of the thin film transistor may be disposed on the interlayer insulating layer 606 to be spaced apart from each other.

In aspects of the disclosure, a reference numeral 307 may indicate a drain electrode, and a reference numeral 308 may indicate a source electrode.

The source electrode 607 and the drain electrode 308 may include any one of a metal such as e.g., aluminum (Al), gold (Au), silver (Ag), copper (Cu), tungsten (W), molybdenum (Mo), chromium (Cr), tantalum (Ta), titanium (Ti), or the like, or an alloy thereof, but the disclosure is not limited thereto.

Each of the source electrode 607 and the drain electrode 608 may be connected to part of a top surface of the active layer 603 through a contact hole provided in the interlayer insulating layer 606.

A planarization layer 609 may be disposed on the substrate 601 on which the source electrode 607 and the drain electrode 608 are disposed.

Although not shown in the drawings, a protective layer including an inorganic insulating material may be further disposed underneath the planarization layer 609.

A first electrode 211d of the fourth emission device ED4 may be disposed on part of a top surface of the planarization layer 609.

The first electrode 211 may be electrically connected to the source electrode 307 of the thin film transistor through a contact hole provided in the planarization layer 609. Although FIG. 6 illustrates a structure in which the first electrode 211d is connected to the source electrode 607 of the thin film transistor, the disclosure is not limited thereto, and the first electrode 211d may be connected to the drain electrode 608 of the thin film transistor.

Although FIG. 6 illustrates a structure in which the first electrode 211d is of a single layer, the disclosure is not limited thereto. For example, the first electrode 211d may have a multi-layer structure with two or more layers.

This first electrode 211d may include a reflective electrode.

Specifically, when the first electrode 211d is of a single-layer structure, the first electrode 211d may be a reflective electrode including a reflective conductive material.

When the first electrode 211d is of a multi-layer structure, at least one layer may be a reflective electrode inclusive of a reflective conductive material. Further, a layer other than the reflective electrode may be a layer made of a transparent conductive material.

A bank 620 may be disposed on the planarization layer 609.

The bank 620 may be disposed to overlap part of a top surface of the first electrode 211d. Further, the bank 620 may be disposed to expose part of the top surface of the first electrode 211d.

This bank 620 may define an emission area EA and a non-emission area NEA in the active area AA of the display device 100 having switchable viewing angles. For example, as shown in FIG. 6, an area in which the bank 620 is disposed in the active area AA may be the non-emission area NEA, and an area in which the bank 620 is not disposed in the active area AA may be the fourth emission area EA4.

An emission layer 212d of the fourth emission device ED4 may be disposed on the first electrode 211d.

The emission layer 212d may be disposed on a top surface of the first electrode 211d exposed by the bank 620.

Although FIG. 6 shows a structure in which the emission layer 212d is of a single layer, the disclosure is not limited thereto. The emission layer 212d may be formed of a multi-layered organic layer.

The emission layer 212d of the fourth emission device ED4 disposed in the fourth emission area EA4 may emit light in the wavelength band of ultraviolet ray.

A second electrode 213 of the emission device ED may be disposed on the substrate 601 on which the emission layer 212d is disposed.

The second electrode 213 may include a transparent conductive material or a semi-transmissive material.

Further, although FIG. 6 shows that the second electrode 213 is of a single-layer structure, the disclosure is not limited thereto, and it may be formed of a multi-layer structure with two or more layers.

An encapsulation layer 630 may be disposed on the second electrode 213.

The encapsulation layer 630 may include a first encapsulation layer 631 disposed on the second electrode 213 of the fourth emission device ED4, a second encapsulation layer 632 disposed on the first encapsulation layer 631, and a third encapsulation layer 633 disposed on the second encapsulation layer 632. Here, the first and third encapsulation layers 631 and 633 may include an inorganic insulating material, and the second encapsulation layer 632 may include an organic insulating material.

The first and third encapsulation layers 631 and 633 including an inorganic insulating material may serve to prevent penetration of moisture and oxygen, and the second encapsulation layer 632 including an organic insulating material may serve to delay the movement of a small amount of moisture and oxygen permeated through the third encapsulation layer 633.

Although not shown in the drawing, the encapsulation layer 630 may be disposed in the active area AA as well as the non-active area NA of the display device 100 having switchable viewing angles.

A photochromic layer 350 may be disposed on the encapsulation layer 630.

The photochromic layer 350 shown in FIG. 6 is in a state when the display device 100 having switchable viewing angles is in the normal mode, and the photochromic layer 350 may be in a transparent state in an area corresponding to the fourth emission area EA4 and an area corresponding to the non-emission area NEA.

In the meantime, although FIG. 6 shows the fourth emission area EA4 and the non-emission area NEA adjacent to the fourth emission area EA4, a cross-sectional structure of the first to third emission areas EA1, EA2, EA3 and the non-emission area NEA adjacent to each emission area may correspond to the structure in FIG. 6.

Then, the structures of the first to fourth emission areas EA1, EA2, EA3, and EA4 and the non-emission area NEA surrounding the same according to aspects of the disclosure will be described hereinafter.

Figure 7:
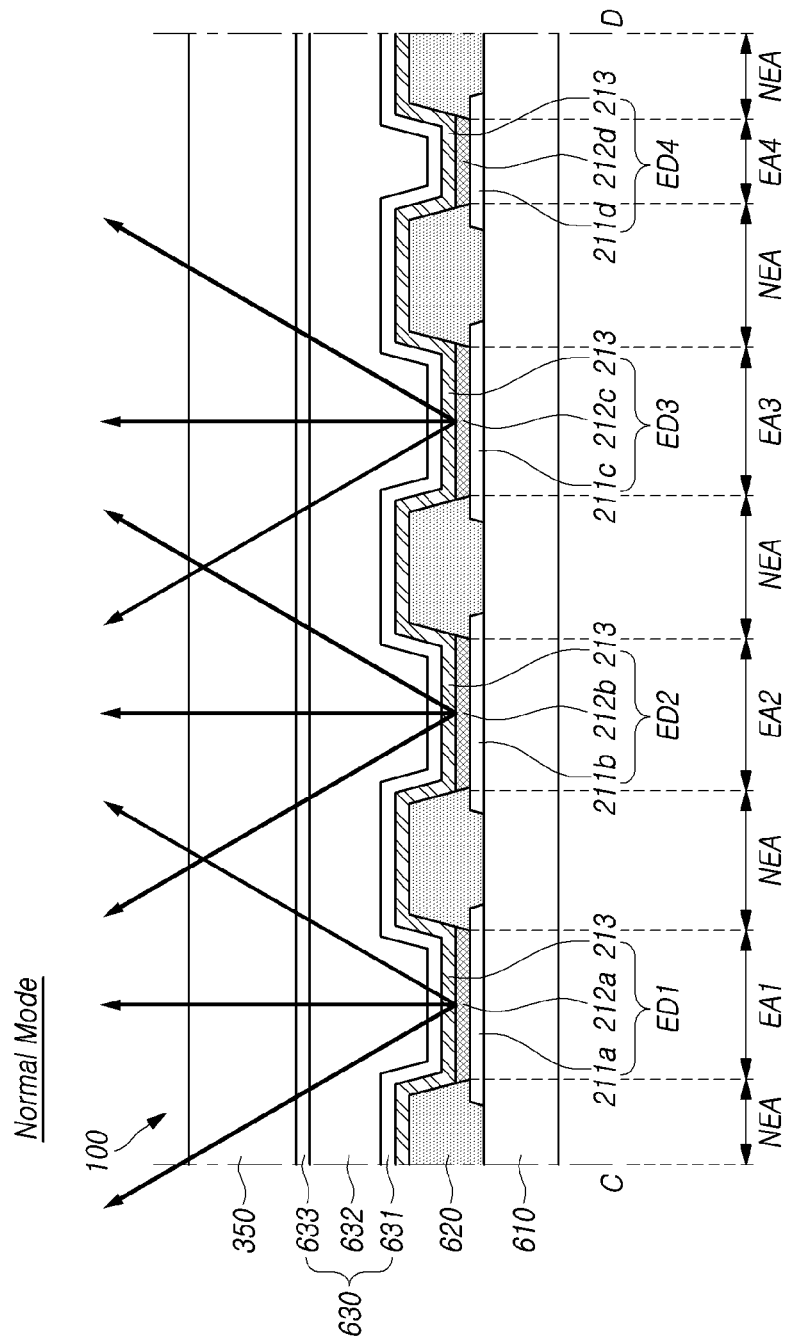
FIGS. 7 and 8 show cross-sectional views taken along line C-D of FIG. 5.
Figure 8:
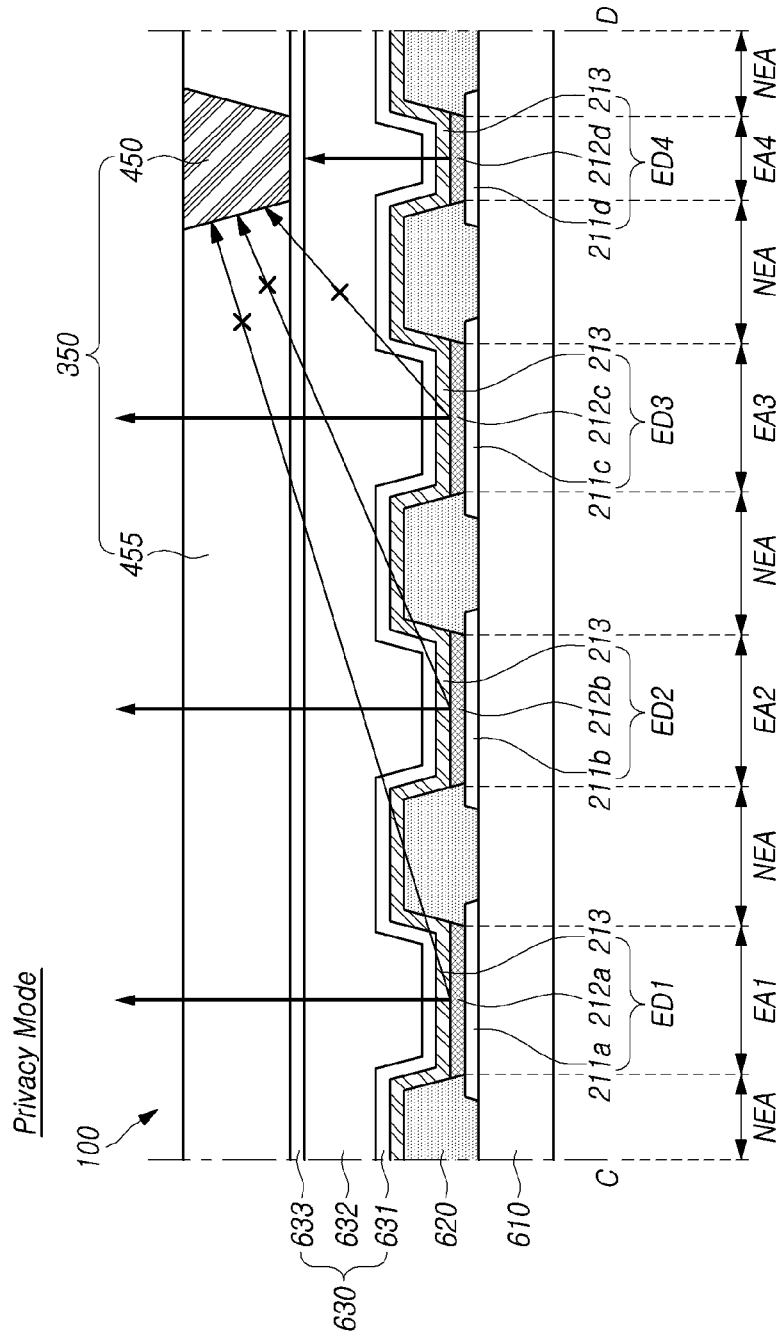

FIGS. 7 and 8 are cross-sectional views taken along a line C-D of FIG. 5.

Here, FIG. 7 shows a structure of the display device 100 having switchable viewing angles in the normal mode according to aspects of the disclosure, and FIG. 8 shows a structure of the display device 100 having switchable viewing angles in the privacy mode according to aspects of the disclosure.

In the following description, any contents (configuration, effect, etc.) that are overlapped with the foregoing aspects may be omitted. Further, throughout the following description, the same reference numerals may be used for components overlapping those of the above-described aspects.

Meanwhile, although not shown in FIGS. 7 and 8, a plurality of thin film transistors electrically connected to the first electrode 211 of the emission device ED may be further disposed on the substrate 610.

Referring now to FIG. 7, the display device 100 having switchable viewing angles according to aspects of the disclosure may include first to fourth emission areas EA1, EA2, EA3, EA4 formed in the active area AA, and a non-emission area NEA surrounding the first to fourth emission areas EA1, EA2, EA3, and EA4.

Each of the first to fourth emission areas EA1, EA2, EA3, and EA4 may be spaced apart from each other, and a non-emission area NEA may be disposed in between the first to fourth emission areas EA1, EA2, EA3, and EA4.

The first emission device ED1 may be disposed in the first emission area EA1, the second emission device ED2 may be disposed in the second emission area EA2, the third emission device EA3 may be disposed in the third emission area EA3, and the fourth emission device ED4 may be disposed in the fourth emission area EA4.

The first emission device ED1 may include a first electrode 211a of the first emission device ED1, and an emission layer 212a and a second electrode 213 of the first emission device ED1. The emission layer 212a of the first emission device ED1 may be an emission layer emitting red light.

The second emission device ED2 may include a first electrode 211b of the second emission device ED2, and an emission layer 212b and a second electrode 213 of the second emission device ED2. The emission layer 212b of the second emission device ED2 may be an emission layer emitting green light.

The third emission device ED3 may include a first electrode 211c of the third emission device ED3, and an emission layer 212c and a second electrode 213 of the third emission device ED3. The emission layer 212c of the third emission device ED3 may be an emission layer emitting blue light.

The fourth emission device ED4 may include a first electrode 211d of the fourth emission device ED4, and an emission layer 212d and a second electrode 213 of the fourth emission device ED4. The emission layer 212d of the fourth emission device ED4 may be an emission layer that emits light in the wavelength band of ultraviolet ray.

As shown in FIG. 7, the first to fourth emission devices ED1, ED2, ED3, and ED4 may share one second electrode 213. This second electrode 213 may be disposed in the emission area EA and the non-emission area NEA of the active area AA.

Each of the first to fourth emission areas EA1, EA2, EA3, and EA4 may be included in different subpixels, and each subpixel may be represented by the equivalent circuit described in FIG. 2.

As shown in FIG. 7, when the display device 100 having switchable viewing angles is in the normal mode, the first to third emission devices ED1, ED2, and ED3 respectively disposed the first to third emission areas EA1, EA2 and EA3 may emit light, while the fourth emission device ED4 disposed in the fourth emission area EA4 may emit no light.

In order for the first to third emission areas EA1, EA2 and EA3 to emit light, the first to third emission devices ED1, ED2, and ED3 must be in an ON state. Further, in order for the fourth emission area EA4 to emit no light, the fourth emission device ED4 should be in an OFF state.

In other words, when the display device 100 having switchable viewing angles is in the normal mode, a first node N1 (see FIG. 2) of the driving transistor DRT connected to the first to third emission devices ED1, ED2, and ED3 may be supplied with a sufficient data voltage Vdata.

Further, when the subpixels, in which the first to third emission devices ED1, ED2, and ED3 are disposed, include an emission control transistor EMT, a sufficient driving voltage EVDD may be supplied to the third node N3 (refer to FIG. 2) of the driving transistor DRT connected to the first to third emission devices ED1, ED2, and ED3 by the emission control transistor EMT.

Further, when the display device 100 having switchable viewing angles is in the normal mode, the first node N1 (refer to FIG. 2) of the driving transistor DRT connected to the fourth emission device ED4 may not be supplied with the data voltage Vdata.

Further, when the subpixel in which the fourth emission device ED4 is disposed includes the emission control transistor EMT, the driving voltage EVDD may not be supplied to the third node N3 (refer to FIG. 2) of the driving transistor DRT connected to the fourth emission device ED4 by the emission control transistor EMT.

As described above, when the display device 100 having switchable viewing angles is in the normal mode, light is emitted only from the first to third emission areas EA1, EA2 and EA3 that emit light in the wavelength band of visible light, while no light may be emitted from the fourth emission area EA4 that emits light in the wavelength band of ultraviolet ray.

Then, when the display device 100 having switchable viewing angles is in the normal mode, the photochromic layer 350 disposed on the display panel may be in a transparent state. Accordingly, the light emitted from the emission area emitting light in the wavelength band of visible light may be diffused in various directions passing through the photochromic layer 350, so that a viewer looking at the display device 100 having switchable viewing angles can see a clear image in various directions.

Further, referring to FIG. 8, when the display device 100 having switchable viewing angles is in the privacy mode, the emission devices ED1, ED2, ED3, and ED4 respectively disposed in the first to fourth emission areas EA1, EA2, EA3, and EA4 may emit light.

In order for the first to fourth emission areas EA1, EA2, EA3, and EA4 to emit light, each of the first to fourth emission devices ED1, ED2, ED3, and ED4 must be in an ON state.

In other words, when the display device 100 having switchable viewing angles is in the privacy mode, the first node N1 (see FIG. 2) of the driving transistor DRT connected to the first to fourth emission devices ED1, ED2, and ED3 may be supplied with a sufficient data voltage Vdata.

Further, when the subpixels, in which the first to fourth emission devices ED1, ED2, ED3, and ED4 are disposed, include the emission control transistor EMT, a sufficient driving voltage EVDD may be supplied to the third node N3 (refer to FIG. 2) of the driving transistor DRT connected to the first to fourth emission devices ED1, ED2, ED3, and ED4 by the emission control transistor EMT.

As described above, when the display device 100 having switchable viewing angles is in the privacy mode, light may be emitted from the first to third emission areas EA1, EA2, EA3 emitting light in the wavelength band of visible light as well as the fourth emission area EA4 emitting light in the wavelength band of ultraviolet ray.

The light emitted from the fourth emission area EA4 may be incident on the photochromic layer 350.

An area of the photochromic layer 350 on which the light emitted from the fourth emission area EA4 is incident may be of an opaque area 450. In addition, an area of the photochromic layer 350 on which the light emitted from the fourth emission area EA4 is not incident may be of a transparent area 455. That is to say, when the display device 100 having switchable viewing angles is in the privacy mode, the photochromic layer 350 may include both the opaque area 450 and the transparent area 455.

Here, the opaque area 450 of the photochromic layer 350 may include an area in which the photochromic layer 350 corresponds to the fourth emission area EA4. Further, the light of the fourth emission area EA4 may be diffused in various directions to be incident on the photochromic layer 350, and thus, some portions of the opaque area 450 of the photochromic layer 350 may not overlap with the fourth emission area EA4.

As described above, when the photochromic layer 350 includes both the opaque area 450 and the transparent area 455, light in a direction perpendicular to a surface of the photochromic layer 350 of the light emitted from the first to third emission areas EA1, EA2, and EA3 may be emitted to the outside via the transparent area 455 of the photochromic layer 350, and the remaining light may be absorbed into the opaque area 450 of the photochromic layer 350.

Further, the entire light emitted from the fourth emission area EA4 may be absorbed into the opaque area 450 of the photochromic layer 350.

Therefore, when the display device 100 having switchable viewing angles is in the privacy mode, the light in the direction perpendicular to the surface of the photochromic layer 350 can be emitted to the outside of the display device 100 having switchable viewing angles, thereby implementing a narrow viewing angle state.

Further, when the operation of the fourth light emitting element ED4 is turned off with the display device 100 having switchable viewing angles in the privacy mode, the opaque area 450 of the photochromic layer 350 can be changed to the transparent area 455, thereby switching the display device 100 having switchable viewing angles to the normal mode.

That is to say, the display device 100 having switchable viewing angles according to aspects of the disclosure can be switched between the normal mode and the privacy mode depending on whether the fourth emission device ED4 is driven or not.

In the meantime, FIGS. 5 to 8 describe the structure in which the fourth emission area EA4 is disposed on the leftmost or rightmost side of the first to third emission areas EA1, EA2 and EA3 in one pixel, but the disclosure is not limited thereto.

Figure 9:
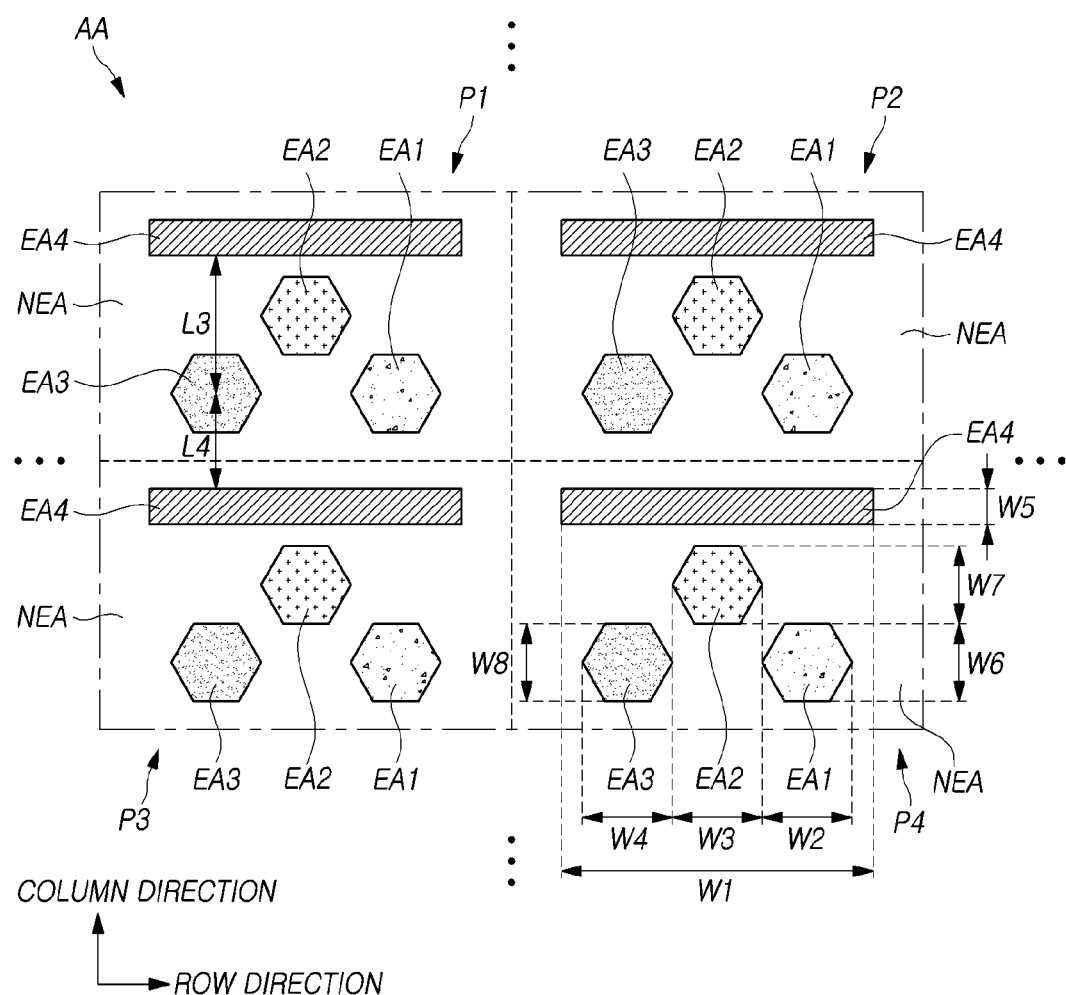
FIG. 9 shows a diagram illustrating another structure of an active area in a display device having switchable viewing angle according to aspects of the disclosure.
Figure 10:
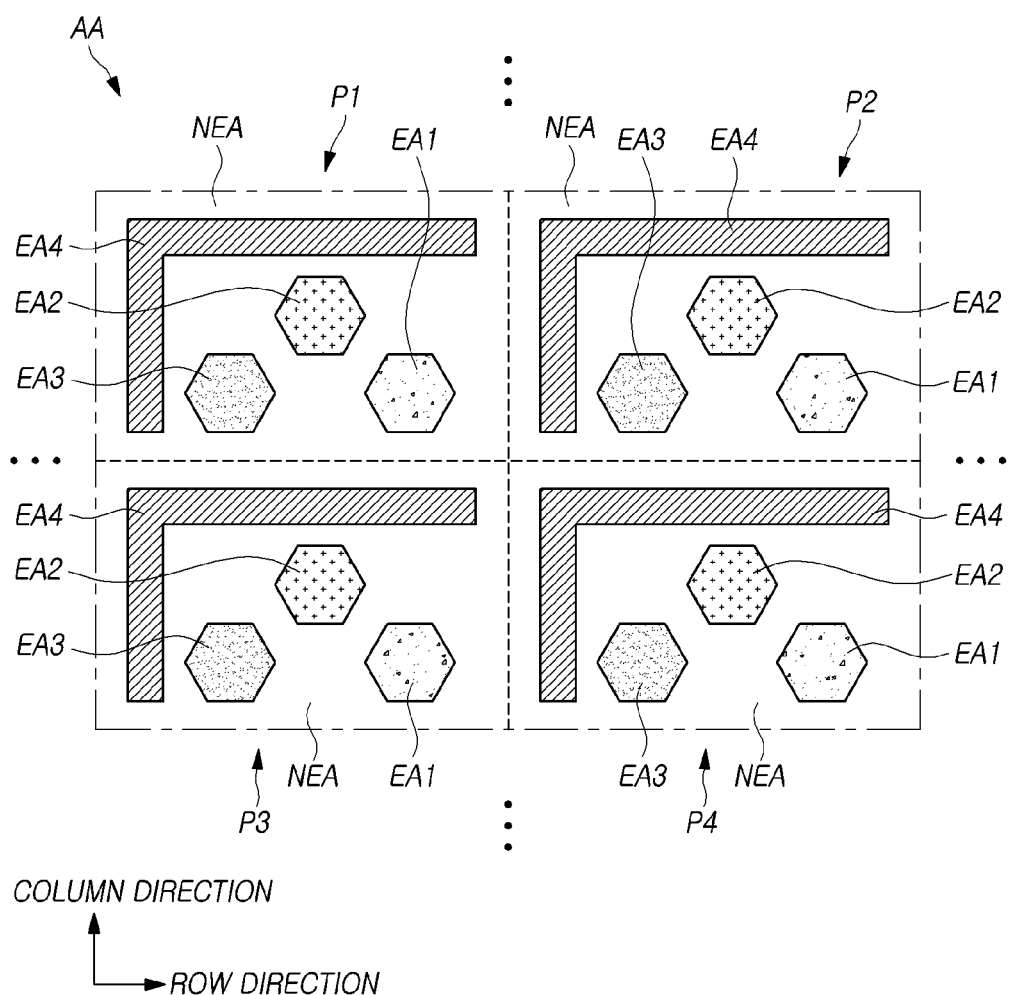
FIG. 10 shows a diagram illustrating another structure of an active area in a display device having switchable viewing angle according to aspects of the disclosure.

Referring now to FIGS. 9 and 10, description will be made on another possible structures of the display device 100 having switchable viewing angles according to aspects of the disclosure.

FIG. 9 is a diagram illustrating another structure of an active area of a display device having switchable viewing angle according to aspects of the disclosure.

In the following description, the contents (configuration, effect, etc.) that may be overlapped with the foregoing aspects may be omitted. Further, throughout the following description, the same reference numerals may be used for any components overlapping those of the foregoing aspects.

Referring now to FIG. 9, the display device 100 having switchable viewing angles may include an active area AA.

The active area AA may include a plurality of pixels P1, P2, P3, and P4, and the plurality of pixels P1, P2, P3, and P4 each may include a first emission area EA1, a second emission area EA2, a third emission area EA3, and a fourth emission area EA4. Further, the first to fourth emission areas EA1, EA2, EA3, and EA4 may be spaced apart from each other in one pixel.

As shown in FIG. 9, in each pixel, the fourth emission area EA4 may be disposed on at least one side of the first to third emission areas EA1, EA2, and EA3. For example, in each pixel, the fourth emission area EA4 may be disposed above each of the first to third emission areas EA1, EA2 and EA3, seen in a plan view.

Such a structure makes it possible to obtain an effect that the fourth emission area EA4 is disposed above and beneath the first to third emission areas EA1, EA2 and EA3 in at least one pixel.

For example, above each of the first to third emission areas EA1, EA2 and EA3 included in the first pixel P1 is disposed the fourth emission area EA4 included in the first pixel P1, and underneath each of the first to third emission areas EA1, EA2, EA3 included in the first pixel P1 is disposed the fourth emission area EA4 included in a third pixel P3 arranged in the column direction from the first pixel P1. Accordingly, the fourth emission area EA4 may be disposed in an upper and lower sides of the first to third emission areas EA1, EA2 and EA3 included in at least one pixel.

Here, the arrangement that the fourth emission area EA4 is disposed on the left side of the first to third emission areas EA1, EA2, EA3 may mean that the fourth emission area EA4 of the first to fourth emission areas EA1, EA2, EA3, and EA4 is located at the uppermost side thereof. Further, the arrangement that the fourth emission area EA4 is disposed on the right side of the first to third emission areas EA1, EA2 and EA3 may mean that the fourth emission area EA4 of the first to fourth emission areas EA1, EA2, EA3, and EA4 is located at the lowermost side thereof.

As shown in FIG. 9, in case where the fourth emission area EA4 is disposed above and below the first to third emission areas EA1, EA2 and EA3 included in at least one pixel, and the display device 100 having switchable viewing angles is in the privacy mode, light directed to the upper side and the lower side of each emission area of the light emitted from each of the first to third emission areas EA1, EA2, and EA3 may be absorbed into the opaque area 450 of the photochromic layer 350, so that it cannot be emitted to the outside of the display device 100 having switchable viewing angles. Accordingly, reducing the luminance in the vertical direction of the display device 100 having switchable viewing angles enables implementing a narrow viewing angle state.

When the display device 100 having switchable viewing angles is in the normal mode, no light is emitted from the fourth emission area EA4, so that the entire photochromic layer 350 may be in a transparent state. Accordingly, the light emitted from the first to third emission areas EA1, EA2 and EA3 may be emitted to the outside of the display device 100 having switchable viewing angles, in various directions, thereby making it possible to implement a wide viewing angle state.

When the fourth emission area EA4 is disposed above each of the first to third emission areas EA1, EA2, and EA3, a distance between the center of at least one emission area emitting light in the wavelength band of visible light of the emission areas disposed in the active area AA and the fourth emission area EA4 disposed on the upper side thereof may be different from a distance between the center of at least one emission area emitting light in the wavelength band of visible light of the emission areas disposed in the active area AA and the fourth emission area EA4 disposed on the lower side thereof.

For example, a distance L3 between the third emission area EA3 disposed in the first pixel P1 of FIG. 5 and the fourth emission area EA4 (i.e., the fourth emission area disposed in the first pixel) disposed in the upper side of the third emission area EA3 may be shorter than a fourth distance L4 between the third emission area EA3 disposed in a third pixel P3 and the fourth emission area EA4 (i.e., the fourth emission area disposed in the third pixel adjacent to the first pixel in a column direction) disposed in the lower side of the third emission area EA3.

Here, the third distance L3 and the fourth distance L4 may be lengths based on the column direction, and the column direction may be a direction corresponding to the extending direction of the data lines of FIG. 1.

In the meantime, when the display device 100 having switchable viewing angles is in the privacy mode, the light emitted in a direction not perpendicular to a surface of the photochromic layer 350 of the light emitted from the third emission area EA3 may be absorbed into the opaque area 450 of the photochromic layer 350 formed owing to the fourth emission area EA4 disposed above and below the third emission area EA3.

Accordingly, although the distance between the center of at least one emission area emitting light in the wavelength band of visible light of the emission areas disposed in the active area AA and the fourth emission area EA4 disposed in the upper side thereof may be different from the distance between the center of at least one emission area emitting light in the wavelength band of visible light of the emission areas disposed in the active area AA and the fourth emission area EA4 disposed in the lower side thereof, it is possible to implement a narrow viewing angle state when the display device 100 having switchable viewing angles is in the privacy mode.

In the above, description has been made on the structure that within each cell, the fourth emission area EA4 is disposed above (or in the upper side) each of the first to third emission areas EA1, EA2, and EA3, but the disclosure is not limited thereto, and the fourth emission area EA4 may be disposed underneath (or in the lower side) each of the first to third emission areas EA1, EA2, and EA3.

Further, as shown in FIG. 9, when the fourth emission area EA4 is disposed above (or underneath) each of the first to third emission areas EA1, EA2 and EA3, in one pixel, a first length W1 in the row direction of the fourth emission area EA4 may be equal to or longer than a sum of a second length W2 in the row direction of the first emission area EA1, a third length W3 in the row direction of the second emission area EA2, and a fourth length W4 in the row direction of the third emission area EA3.

Here, each of the first to fourth lengths W1, W2, W3, and W4 in the row direction of each of the emission areas may stand for the maximum length of the fourth emission area EA4 and the first to third emission areas EA1, EA2, and EA3 in the direction in which the gate line of FIG. 1 extends, on a plan view.

When the first length W1 of the fourth emission area EA4 is less than the sum of the second to fourth lengths W2, W3, and W4 of the first to third light emission areas EA1, EA2, EA3, and the display device 100 having switchable viewing angles is in the privacy mode, part of the light emitted in other direction, not perpendicular to the surface of the photochromic layer 350 of the light emitted from the first to third emission areas EA1, EA2, and EA3, may not be absorbed so as to deteriorate the effect of reducing the luminance in the vertical direction. Accordingly, it may make it difficult to implement the narrow viewing angle state of the display device 100 having switchable viewing angles.

Accordingly, when the fourth emission area EA4 is disposed above the first to third emission areas EA1, EA2, and EA3, one fourth emission area EA4 in one pixel may be disposed to correspond to the entire top surface of each of the first to third emission areas EA1, EA2, and EA3.

Further, when the fourth emission area EA4, in one pixel, is disposed above (or below) each of the first to third emission areas EA1, EA2 and EA3, a fifth length W5 in the column direction of the fourth emission area EA4 may be shorter than each of a sixth length W6 in the column direction of the first emission area EA1, a seventh length W7 in the column direction of the second light emission area EA2, and an eighth length W8 in the column direction of the third emission area EA3.

Further, the fifth length W5 of the fourth emission area EA4 may be shorter than the first length W1 of the fourth emission area EA4. Accordingly, as the area of the fourth emission area EA4 is increased in one pixel, the area occupied by the first to third emission areas EA1, EA2 and EA3 emitting light in the wavelength band of visible light may be reduced, so that it is possible to prevent deterioration of the luminance characteristic of the device 100 having switchable viewing angles.

Here, each of the fifth to eighth lengths W5, W6, W7, and W8 that are lengths in the column direction may stand for the maximum length of the fourth emission area EA4 and the first to third emission areas EA1, EA2, and EA3 in the direction in which the data line of FIG. 1 extends on a plan view.

FIG. 10 shows a diagram illustrating another structure of an active area of a display device having switchable viewing angle according to aspects of the disclosure.

In the following description, the contents (configuration, effect, etc.) that are overlapped with the foregoing aspects may be omitted. Further, throughout the following description, the same reference numerals may be used for any components overlapping those of the foregoing aspects.

Referring now to FIG. 10, the display device 100 having switchable viewing angles according to aspects of the disclosure may include an active area AA.

The active area AA may include a plurality of pixels P1, P2, P3, and P4, and each of the plurality of pixels P1, P2, P3, and P4 may include a first emission area EA1, a second emission area EA2, a third emission area EA3, and a fourth emission area EA4. Further, each of the first to fourth emission areas EA1, EA2, EA3, and EA4 may be formed to be surrounded by a non-emission area NEA.

Further, as shown in FIG. 10, a portion of the fourth emission area EA4 in each pixel may be disposed on the left side of each of the first to third emission areas EA1, EA2, and EA3. Then, the remaining part of the fourth emission area EA4 may be disposed above the first to third emission areas EA1, EA2, and EA3.

This structure makes it possible to obtain the effect that the fourth emission area EA4 is disposed in the left and right sides of the first to third emission areas EA1, EA2, EA3 included in at least one pixel, and the fourth emission area EA4 is disposed in the upper side and the lower side of the first to third emission areas EA1, EA2 and EA3.

Specifically, in the left side of each of the first to third emission areas EA1, EA2 and EA3 included in the first pixel P1 may be disposed the fourth emission area EA4 included in the first pixel P1, and in the right of each of the first to third emission areas EA1, EA2 and EA3 included in the first pixel P1 may be disposed the fourth emission area EA4 included in the second pixel P2 arranged in the row direction from the first pixel P1. Accordingly, the fourth emission area EA4 may be disposed in the left and right sides of the first to third emission areas EA1, EA2 and EA3 included in at least one pixel.

Further, the fourth emission area EA4 included in the first pixel P1 may be disposed above each of the first to third emission areas EA1, EA2 and EA3 included in the first pixel P1, and the fourth emission area EA4 included in the third pixel P3 arranged in the column direction from the first pixel P1 may be disposed underneath each of the first to third emission areas EA1, EA2 and EA3 included in the first pixel P1. Accordingly, the fourth emission area EA4 may be disposed above and below the first to third emission areas EA1, EA2 and EA3 included in at least one pixel.

When the display device 100 having switchable viewing angles is in the privacy mode, the light directed to the left and right side of each emission area of the light emitted from each of the first to third emission areas EA1, EA2, and EA3 may be absorbed into the opaque area 450 of the photochromic layer 350 so that it cannot be emitted to the outside of the display device 100 having switchable viewing angles.

Further, when the display device 100 having switchable viewing angles is in the privacy mode, the light directed to the upper and lower sided of each emission area of the light emitted from each of the first to third emission areas EA1, EA2, EA3 may be absorbed into the opaque area 450 of the photochromic layer 350 so that it cannot be emitted to the outside of the display device 100 having switchable viewing angles.

Accordingly, it is possible to implement a narrow viewing angle state by reducing the luminance of the display device 100 having switchable viewing angles in both the vertical and horizontal directions.

Since no light is emitted from the fourth emission area EA4 when the display device 100 having switchable viewing angles is in the normal mode, the entire photochromic layer 350 may be in a transparent state. Accordingly, the light emitted from the first to third emission areas EA1, EA2 and EA3 may be emitted to the outside of the display device 100 having switchable viewing angles, in various directions, thereby enabling implementing a wide viewing angle state.

Meanwhile, although FIG. 10 illustrates a structure in which a portion of the fourth emission area EA4 is disposed on the left side of each of the first to third emission areas EA1, EA2 and EA3, in each pixel, the disclosure is not limited thereto, and a portion of the fourth emission area EA4 may be disposed on the right side of each of the first to third emission areas EA1, EA2, and EA3.

Further, FIG. 10 illustrates a structure in which the remaining portion of the fourth emission area EA4, in each pixel, is disposed above each of the first to third emission areas EA1, EA2, and EA3, but the disclosure is not limited thereto, and the remaining portion of the fourth emission area EA4 may be disposed underneath each of the first to third emission areas EA1, EA2, and EA3.

In the meantime, in FIGS. 3 to 10, description has been made on the structure in which the fourth emission area EA4 for emitting light in the wavelength band of ultraviolet ray is disposed in each sub-pixel, but the disclosure is not limited thereto.

Hereinafter, the structure of the active area of the display device having switchable viewing angle according to another aspect of the disclosure will be described.

FIG. 11 is a diagram illustrating a portion of an active area of a display device having switchable viewing angle according to another aspect of the disclosure.

In the following description, the contents (configuration, effects, etc.) overlapping the foregoing aspects may be omitted. Further, throughout the following description, the same reference numerals may be used for the components overlapping those of the foregoing aspects.

Referring now to FIG. 11, the active area AA of the display device 100 having switchable viewing angles according to another aspect of the disclosure may include a plurality of pixels P1, P2, and P3.

The plurality of pixels P1, P2, and P3 may include first to third emission areas EA1, EA2, and EA3, respectively. In addition, some of the plurality of pixels P1, P2, and P3 may include a fourth emission area EA4. The first to third emission areas EA1, EA2, EA3 and the fourth emission area EA4 may be surrounded by a non-emission area NEA.

For example, as shown in FIG. 10, the first and third pixels P1 and P3 may include first to fourth emission areas EA1, EA2, EA3, and EA4. Further, the second pixel P2 positioned between the first and third pixels P1 and P3 may include the first to third emission areas EA1, EA2, and EA3, and may not include the fourth emission area EA4.

Such a structure makes it possible to implement a narrow viewing angle state by reducing the luminance in the left and right directions, when the display device 100 having switchable viewing angles is in the privacy mode.

Specifically, on the left side of each of the first to third emission areas EA1, EA2 and EA3 included in the first pixel P1 may be disposed the fourth emission area EA4 included in the first pixel P1, and on the right of each of the first to third emission areas EA1, EA2 and EA3 included in the first pixel P1 may be disposed the fourth emission area EA4 included in the third pixel P3 arranged in the row direction from the first pixel P1.

Further, the fourth emission area EA4 included in the first pixel P1 may be disposed on the left side of each of the first to third emission areas EA1, EA2 and EA3 included in the second pixel P2, and the fourth emission area EA4 included in the third pixel P3 arranged in the row direction from the second pixel P2 may be disposed on the right side of each of the first to third emission areas EA1, EA2 and EA3 included in the second pixel P2.

As described above, although the second pixel P2 in which the fourth emission area EA4 is not disposed is disposed between the first pixel P1 and the third pixel P3 in which the fourth emission area EA4 is disposed, it is possible to implement the narrow viewing angle state by reducing the luminance of the display device 100 having switchable viewing angles in the left and right directions, when the display device 100 having switchable viewing angles is in the privacy mode.

Further, the structure of the display device 100 having switchable viewing angles according to another aspect of the disclosure is not limited to the foregoing, and two pixels in which the fourth emission area EA4 is not disposed may be disposed between the first pixel P1 and the third pixel, in which the fourth emission area EA4 is disposed.

However, when three or more pixels with no fourth emission area EA4 being disposed are disposed between the first pixel P1 and the third pixel P3, in which the fourth emission area EA4 is disposed, and the display device 100 having switchable viewing angles is in the privacy mode, the luminance reduction ability of the display device 100 having switchable viewing angles in the left and right directions may deteriorate, so that it can make it difficult to implement the narrow viewing angle state in the left and right directions of the display device 100 having switchable viewing angles.

Further, FIG. 11 shows the structure that the fourth emission area EA4 is disposed on the left side of each of the first to third emission areas EA1, EA2 and EA3 arranged in the first pixel P1 and the third pixels P3, but the disclosure is not limited thereto. Thus, the fourth emission area EA4 may be disposed on the right side, upper side, or lower side of each of the first to third emission areas EA1, EA2 and EA3 disposed in the first pixel P1 and the third pixels P3.

As described above, such selective reduction of the luminance of the display device 100 having switchable viewing angles, according to aspects of the disclosure will make it possible to easily control the luminance of the display device 100 having switchable viewing angles according to a viewing angle.

For example, when the display device 100 having switchable viewing angles is a display for a vehicle, its driver may look at the display panel 110 in a diagonal direction with respect to a screen surface of the display panel 110, which direction is not perpendicular to the surface of the display panel 110 of the display device.

The display device 100 having switchable viewing angles according to the aspects of the disclosure can make it easier to secure a field of view for the driver, by reducing the luminance in the upper and lower sides or the left and right sides of the display panel 110 through the fourth emission area EA4.

In general, a film having a function for viewing angle luminance control may have a structure with a transmissive region and a non-transmissive region, and a plurality of louvers formed of black resin may be disposed in the non-transmissive region.

The louver may be made from forming a groove in the transmission region formed of white resin, and then filling the groove with black resin.

When a portion of the light emitted from the display panel 110 reaches the non-transmissive area, it may be absorbed into the louver and cannot be emitted to the outside of the display device 100 having switchable viewing angles, so that the front luminance of the display device 100 having switchable viewing angles can be lowered.

Further, when the film including the louver exceeds a certain viewing angle, light leakage may occur, and then, a problem may arise that the louver is visually recognized when the display device 100 having switchable viewing angles is driven.

On the other hand, the display device 100 having switchable viewing angles according to aspects of the disclosure does not include any louver, thereby preventing the louver from being visually recognized. In other words, the display device 100 having switchable viewing angles according to aspects of the disclosure can prevent occurrence of any appearance defect that might be caused by the louver.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device having switchable viewing angle, comprising:
a display panel including a first emission area, a second emission area, a third emission area and a fourth emission area, from which light in different wavelength bands is emitted; and
a transparent photochromic layer disposed on at least one surface of the display panel;
wherein at least one emission area of the first emission area, the second emission area, the third emission area and the fourth emission area emits light in a wavelength band of ultraviolet ray;
wherein, a partial area of the photochromic layer corresponding to the emission area from which the light in the wavelength band of ultraviolet ray is emitted is an opaque area when light is emitted from the first to fourth emission areas.

2. The display device having switchable viewing angle according to claim 1, wherein the photochromic layer includes a geometric isomer material.

3. The display device having switchable viewing angle according to claim 1, wherein the display panel further includes a plurality of pixels, and one of the plurality of pixels includes the first emission area, the second emission area, the third emission area and the at least one fourth emission area.

4. The display device having switchable viewing angle according to claim 3, wherein each of the first emission area, the second emission area and the third emission area is an area from which light in a wavelength band of visible light is emitted, and
wherein the fourth emission area is an area from which light in the wavelength band of ultraviolet ray is emitted.

5. The display device having switchable viewing angle according to claim 4, a partial area of the photochromic layer corresponding to the first emission area, the second emission area and the third emission area is a transparent area wherein when light is emitted from the first emission area, the second emission area and the third emission area.

6. The display device having switchable viewing angle according to claim 5, wherein an area of the photochromic layer corresponding to the fourth emission area is an opaque area when light is emitted from the fourth emission area.

7. The display device having switchable viewing angle according to claim 5, wherein a remaining area of the photochromic layer corresponding to the fourth emission area is a transparent area when the fourth emission area is in a non-emission state.

8. The display device having switchable viewing angle according to claim 4, wherein, in at least one of the pixels, the fourth emission area is disposed on at least one side of each of the first emission area, the second emission area and the third emission area.

9. The display device having switchable viewing angle according to claim 4, wherein the plurality of pixels include a first pixel and a second pixel disposed in one side of the first pixel; and
wherein a distance between the first emission area and the fourth emission area in the first pixel is different from a distance between the first emission area included in the first pixel and the fourth emission area in the second pixel.

10. The display device having switchable viewing angle according to claim 4, wherein the display panel includes a first pixel and a second pixel arranged in one direction,
wherein each of the first pixel and the second pixel includes the fourth emission area, and
wherein two or less pixels not including fourth emission area are disposed between the first pixel and the second pixel.

11. The display device having switchable viewing angle according to claim 1, wherein, when light is emitted from the first emission area, the second emission area, the third emission area and the fourth emission area, the display device having switchable viewing angle is in a privacy mode; and
when light is emitted from the first emission area, the second emission area and the third emission area and no light is emitted from the fourth emission area, the display device having switchable viewing angle is in a normal mode.

12. The display device having switchable viewing angle according to claim 10, wherein, when the display device having switchable viewing angle is in a privacy mode, a data voltage is supplied to a driving transistor driving each of the first to fourth emission areas, and a driving voltage is supplied to the driving transistor.

13. The display device having switchable viewing angle according to claim 10, wherein, when the display device having switchable viewing angle is in a normal mode, a data voltage is not supplied to a driving transistor driving each of the first to third emission areas or a driving voltage is not supplied to the driving transistor.

14. The display device having switchable viewing angle according to claim 1, wherein the display panel further includes:
a substrate;
a plurality of emission devices disposed on the substrate; and
an encapsulation layer disposed on the emission device, wherein the photochromic layer is disposed on the encapsulation layer.

15. The display device having switchable viewing angle, comprising:
a display panel including a first emission area, a second emission area, a third emission area and a fourth emission area, from which light in different wavelength bands is emitted; and
a transparent photochromic layer disposed on at least one surface of the display panel,
wherein each of the first emission area, the second emission area and the third emission area emits light in a wavelength band of visible light, and the fourth emission area emits light in a wavelength band of ultraviolet ray,
when the fourth emission area is in an emission-state, an area of the photochromic layer including the area corresponding to the fourth emission area is an opaque area, and
when the fourth emission area is in a non-emission state, an area of the photochromic layer including the area corresponding to the fourth emission area is a transparent area.

* * * * *